US010691372B1

(12) United States Patent
Seetharaman et al.

(10) Patent No.: US 10,691,372 B1
(45) Date of Patent: Jun. 23, 2020

(54) TRANSISTOR THRESHOLD VOLTAGE MAINTENANCE IN 3D MEMORY

(71) Applicant: Western Digital Technologies, Inc., San Jose, CA (US)

(72) Inventors: Srinivasan Seetharaman, Milpitas, CA (US); Piyush Sagdeo, Milpitas, CA (US); Sourabh Sankule, Bangalore (IN); Chris Yip, Milpitas, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 89 days.

(21) Appl. No.: 16/213,590

(22) Filed: Dec. 7, 2018

(51) Int. Cl.
| | | |
|---|---|---|
| *G11C 16/14* | (2006.01) | |
| *G06F 3/06* | (2006.01) | |
| *G11C 16/34* | (2006.01) | |
| *G11C 16/04* | (2006.01) | |
| *H01L 27/11556* | (2017.01) | |
| *H01L 27/11582* | (2017.01) | |
| *H01L 27/1157* | (2017.01) | |
| *H01L 27/11519* | (2017.01) | |
| *H01L 27/11565* | (2017.01) | |
| *H01L 27/11524* | (2017.01) | |

(52) U.S. Cl.
CPC .......... *G06F 3/0653* (2013.01); *G06F 3/0616* (2013.01); *G06F 3/0679* (2013.01); *G11C 16/0483* (2013.01); *G11C 16/14* (2013.01); *G11C 16/349* (2013.01); *H01L 27/11556* (2013.01); *H01L 27/11582* (2013.01); *H01L 27/1157* (2013.01); *H01L 27/11519* (2013.01); *H01L 27/11524* (2013.01); *H01L 27/11565* (2013.01)

(58) Field of Classification Search
CPC ................................ G11C 16/10; G11C 16/26
USPC .......................................... 365/185.2, 185.24
See application file for complete search history.

(56) References Cited

U.S. PATENT DOCUMENTS

| | | | |
|---|---|---|---|
| 6,850,252 B1 * | 2/2005 | Hoffberg | G06K 9/00369 |
| | | | 348/E7.061 |
| 7,551,612 B2 * | 6/2009 | Kobayashi | H04L 5/16 |
| | | | 370/368 |
| 8,971,119 B2 | 3/2015 | Avila et al. | |
| 9,036,428 B1 | 5/2015 | D'Abreu | |
| 9,298,633 B1 * | 3/2016 | Zhao | G06F 12/0862 |
| 9,418,751 B1 | 8/2016 | Dutta et al. | |
| 9,449,698 B1 | 9/2016 | Paudel et al. | |
| 9,984,760 B1 | 5/2018 | Zhang et al. | |
| 10,008,271 B1 | 6/2018 | Diep et al. | |

(Continued)

*Primary Examiner* — Michael T Tran
(74) *Attorney, Agent, or Firm* — Vierra Magen Marcus LLP

(57) ABSTRACT

Techniques are provided for maintaining threshold voltages of non-data transistors in a memory device. The memory device has a stack comprising alternating horizontal conductive layers and horizontal dielectric layers. A control circuit is configured to test a threshold voltage criterion of non-data transistors in response to a trigger condition being met with respect to an erase of a data memory cells in a first tier of the stack. The control circuit is configured move valid data out of a data memory cells in a second tier of the stack in response to a determination that the threshold voltage criterion is not met. The control circuit is configured to adjust threshold voltages of the non-data transistors after moving the valid data out of the second set of data memory cells such that the threshold voltage criterion is met.

20 Claims, 13 Drawing Sheets

(56) References Cited

U.S. PATENT DOCUMENTS

| | | | |
|---|---|---|---|
| 10,008,277 | B2 | 6/2018 | Pang et al. |
| 10,068,651 | B1 | 9/2018 | Diep et al. |
| 2003/0023902 | A1* | 1/2003 | Frankowsky .......... G11C 29/44 714/25 |
| 2005/0210339 | A1* | 9/2005 | Dimpsey ............ G06F 11/3676 714/57 |
| 2006/0256623 | A1 | 11/2006 | Roohparvar |
| 2008/0024140 | A1* | 1/2008 | Henson ................ H02H 1/0015 324/536 |
| 2008/0195903 | A1* | 8/2008 | Zipprich-Rasch ......................... G11C 29/50004 714/721 |
| 2010/0097862 | A1 | 4/2010 | Kang et al. |
| 2011/0100127 | A1* | 5/2011 | Beck ...................... A61B 5/121 73/585 |
| 2011/0128060 | A1* | 6/2011 | Ishino ................ G06F 13/1689 327/262 |
| 2013/0322174 | A1 | 12/2013 | Li et al. |
| 2014/0036590 | A1 | 2/2014 | Feeley et al. |
| 2014/0100792 | A1* | 4/2014 | Deciu .................. C12Q 1/6869 702/20 |
| 2014/0122689 | A1* | 5/2014 | Park ........................ G06F 21/62 709/224 |
| 2015/0066414 | A1* | 3/2015 | Ouyang ............... G01R 31/287 702/117 |
| 2017/0178736 | A1 | 6/2017 | Yang et al. |
| 2018/0233206 | A1* | 8/2018 | Yu .......................... G11C 16/10 |
| 2018/0275917 | A1* | 9/2018 | Iwai ...................... G06F 3/0679 |
| 2018/0307431 | A1* | 10/2018 | Gunnam ................ G06F 16/137 |
| 2018/0374518 | A1* | 12/2018 | Tseng ................. G11C 16/0483 |

* cited by examiner

TRANSISTOR THRESHOLD VOLTAGE MAINTENANCE IN 3D MEMORY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

One type of non-volatile memory has strings of non-volatile memory cells that have a select transistor at each end of the string. Typically, such strings are referred to as NAND strings. A NAND string may have a drain side select transistor at one end that connects the string to a bit line. A NAND string may have a source side select transistor at one end that connects the string to a source line. The non-volatile memory cells may also be referred to as non-volatile memory cell transistors, with the channels of the non-volatile memory cell transistors collectively being referred to as a NAND string channel.

BRIEF DESCRIPTION OF THE DRAWINGS

Like-numbered elements refer to common components in the different figures.

DETAILED DESCRIPTION

Figure 1:
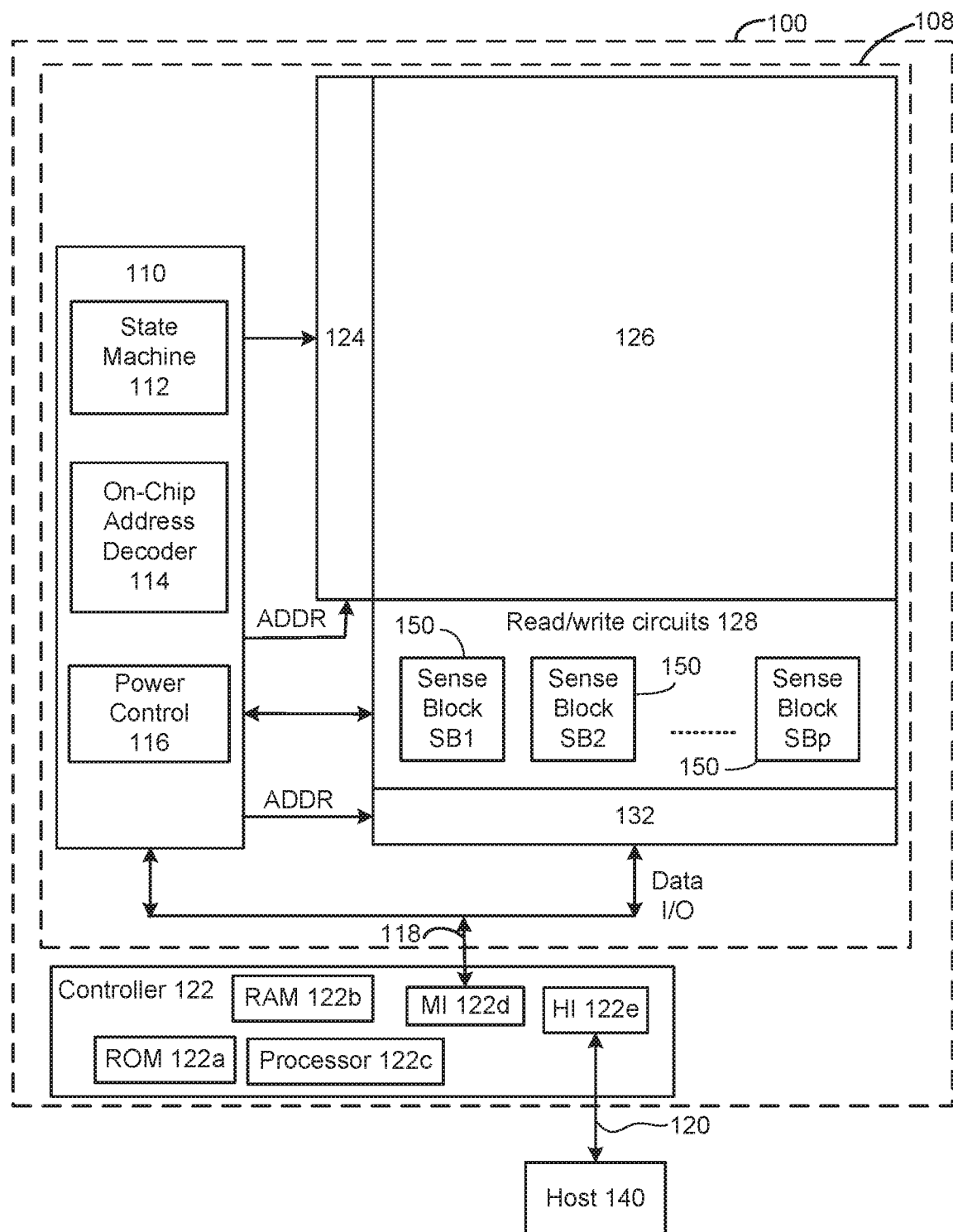
FIG. 1 is a functional block diagram of a memory device.

Techniques are provided for maintaining threshold voltages of non-data transistors in a memory device. The non-data transistors are on NAND strings in a three-dimensional memory device, in one embodiment. The NAND strings run vertically through a stack of alternating horizontal conductive layers and horizontal dielectric layers, in one embodiment. A NAND string comprises data transistors and non-data transistors. A data transistor (e.g., data memory cell transistor) is one that is used to store user or system data. A non-data transistor is not used to store user or system data. Non-data transistors include select transistors and dummy memory cell transistors. Note that data memory cell transistor may more succinctly be referred to as a data memory cell. Also, a dummy memory cell transistor may more succinctly be referred to as a dummy memory cell. A select transistor may be used to select a NAND string or a portion of a NAND string for a memory operation.

The stack comprises tiers, in one embodiment. Each NAND strings has a first set of data memory cells in a first tier of the stack and a second set of data memory cells in a second tier of the stack, in one embodiment. A control circuit may perform a memory array operation (e.g., read, program, erase) on a group of NAND strings. The control circuit operates each tier as an independently functioning unit, in one embodiment. For example, data memory cells in one tier may be erased while maintaining valid data in another tier.

A NAND string comprises a number of memory cells connected in series between one or more drain-side select transistors (or SGD transistors), on a drain-side of the NAND string which is connected to a bit line, and one or more source-side select transistors (or SGS transistors), on a source-side of the NAND string which is connected to a source line. The SGD transistors can be provided in a conductive state, such as when the NAND string is being sensed in a read or verify operation, or in a non-conductive state, such as when the NAND string is being inhibited from programming and its channel voltage is boosted. The SGD transistors can typically be controlled by a control gate voltage and a bit line voltage, while the SGS transistors can typically be controlled by a control gate voltage and a source line voltage.

To accurately control the select transistors, their threshold voltages (Vth) should be in an expected range. However, the threshold voltages can change for various reasons. For example, read disturb stress can cause the Vth to increase. Read disturb stress can be experienced by a transistor which has a large voltage difference between its control gate and channel. For instance, during the read of a memory cell in a NAND string, the unselected memory cells and the select transistors may receive a high pass voltage which can cause read disturb. Due to the high control gate-to-channel voltage, charge can be injected into a charge storage region of the select transistor, gradually increasing the Vth of the select transistor.

Data retention loss can cause the Vth to decrease. Data retention loss may occur gradually over long periods of time. The Vth of the select transistors can also change due to other factors, such as program disturb and defects in the memory device. Some defects are not apparent at the time of manufacture but may appear as the memory device accumulates program-erase cycles and is stressed. One example of a defect is a short circuit. Moreover, the Vth of different select transistors within a chip can vary even when the memory device is new due to process variations or defects.

If Vth of the select transistors changes substantially, it can result in a failure in the memory device. For example, if the Vth is too high in an SGD transistor, the associated NAND string may not be in a fully conductive state during sensing or programming operations. If the Vth is too low in an SGD transistor, the associated NAND string may not be in a fully non-conductive state for an unselected NAND string during programming, impairing the ability to boost the channel voltage and prevent program disturb.

A NAND string may have dummy memory cell transistors, which are memory cells that are not used to store user or system data. A dummy memory cell transistor is sometimes used between a data memory cell transistor and a select transistor. The Vth of a dummy memory cell transistors may also impact the operation of the memory device. If the Vth of a dummy memory cell transistor on a NAND string is too high or too low, a memory operation of a data memory cell on that NAND string could fail.

FIG. 1-FIG. 4E describe one example of a memory system that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase and others) on memory structure 126, and includes state machine 112, an on-chip address decoder 114, and a power control circuit 116. In one embodiment, control circuitry 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The sense blocks include bit line drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two-dimensional arrays, three-dimensional arrays, cross-point arrays, stacked two-dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
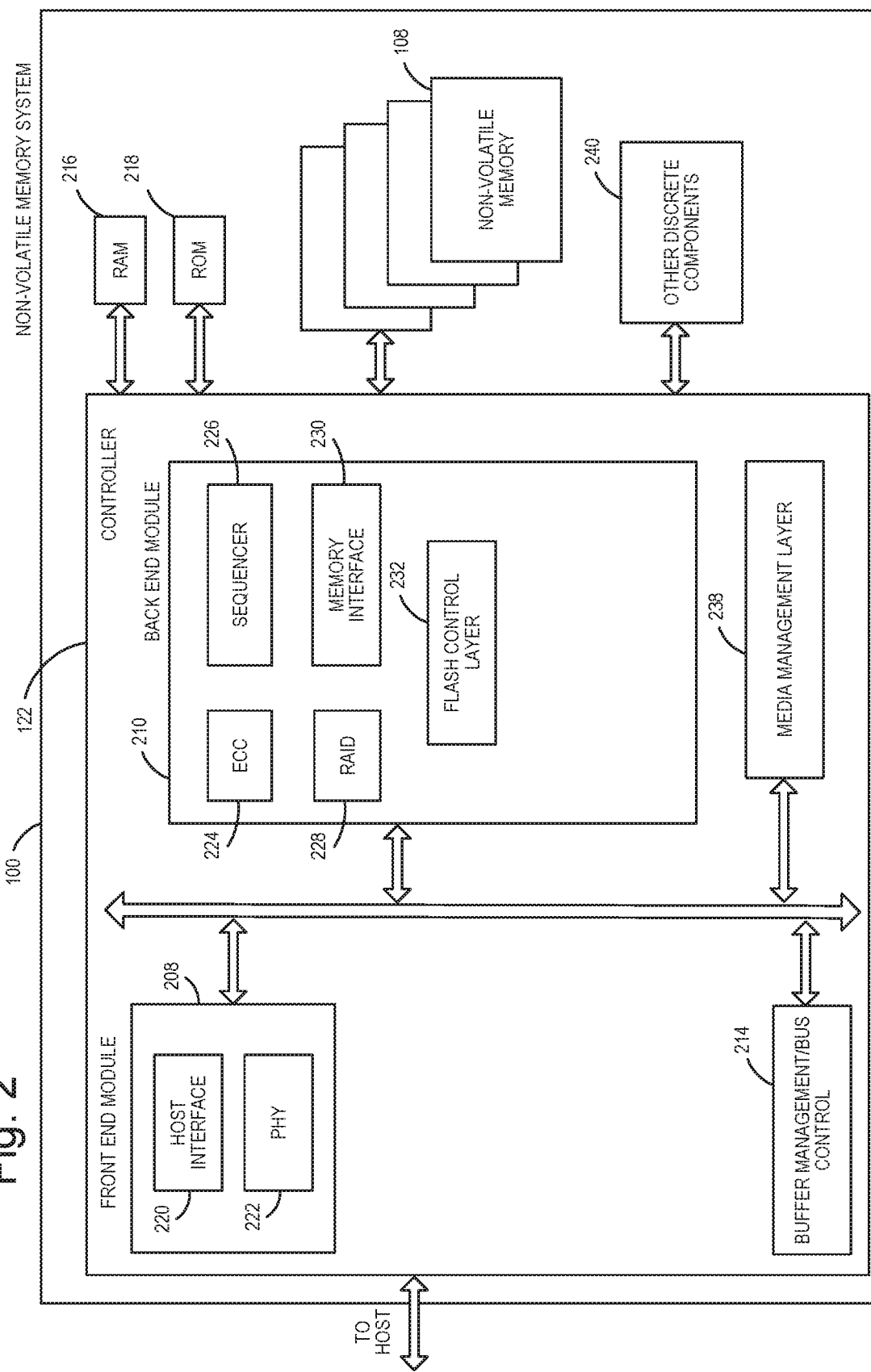
FIG. 2 is a block diagram depicting one embodiment of a memory system.

FIG. 2 is a block diagram of example memory system 100, depicting more details of one embodiment of controller 122. The controller in FIG. 2 is a flash memory controller, but note that the non-volatile memory 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

The memory cells on a memory die 108 can be arranged in one or more planes. In one embodiment, memory operations are performed in parallel on groups of memory cells on different planes on the same memory die. In one embodiment, threshold voltage maintenance of non-data transistors (e.g., select transistors and/or dummy memory cell transistors) is performed in parallel on different planes on the same memory die. In one embodiment, memory operations are performed in parallel on groups of memory cells on different memory die 108. In one embodiment, threshold voltage maintenance of non-data transistors (e.g., select transistors and/or dummy memory cell transistors) is performed in parallel on different memory die.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230, which is configured to be connected to non-volatile memory 108, provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of die 108. The MML 238 may be needed because: 1) the memory may have limited endurance; 2) the memory 126 may only be written in multiples of pages; and/or 3) the memory 126 may not be written unless it is erased as a block (or a tier within a block in some embodiments). The MML 238 understands these potential limitations of the memory 126 which may not be visible to the host. Accordingly, the MML 238 attempts to translate the writes from host into writes into the memory 126.

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

One or more of ECC 224, sequencer 226, RAID 228, flash control layer 232, media management layer 238, and/or buffer management/bus control 214 may be referred to as a processor circuit. The processor circuit can include hardware only or a combination of hardware and software (including firmware). For example, a controller programmed by firmware to perform the functions described herein is one example of a control circuit. A processor circuit can include a processor, PGA (Programmable Gate Array, FPGA (Field Programmable Gate Array), ASIC (Application Specific Integrated Circuit), integrated circuit or other type of circuit.

In one embodiment, the processor circuit performs threshold voltage maintenance of non-data transistors in the non-volatile memory 108. The non-data transistors may include select transistors associated with memory cells that reside in a stack in the non-volatile memory 108. The non-data transistors may include dummy memory cell transistors associated with the memory cells that reside in the stack in the non-volatile memory 108. The stack may include a first set of data memory cells that reside in a first tier of the stack and a second set of data memory cells that reside in a second tier of the stack. In one embodiment, the processor circuit sends one or more commands to the non-volatile memory 108 through the memory interface 230 in order to perform threshold voltage maintenance of non-data transistors in the non-volatile memory 108. The processor circuit may also receive data from the non-volatile memory 108 via the memory interface 230 to perform the threshold voltage maintenance. The data may pertain to the threshold voltage of the non-data transistors in the non-volatile memory 108.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
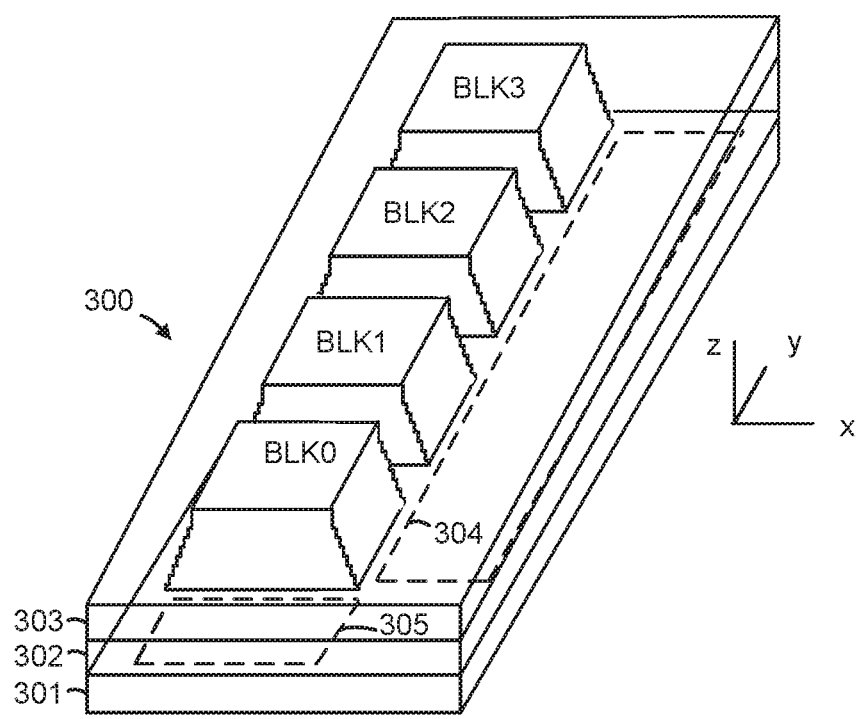
FIG. 3 is a perspective view of a memory device.

FIG. 3 is a perspective view of a memory device 300 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The substrate has a major surface that extends in the x-y plane. The blocks may be formed over the major surface. The peripheral area 304 runs along an edge of each block while the peripheral area 305 is at an end of the set of blocks. Each peripheral area can include circuitry, including but not limited to voltage drivers which can be connected to control gate layers, bit lines and source lines of the blocks.

The substrate 301 can also carry circuitry under the blocks, along with one or more lower metal layers which are patterned in conductive paths to carry signals of the circuitry. The blocks are formed in an intermediate region 302 of the memory device. In an upper region 303 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4A:
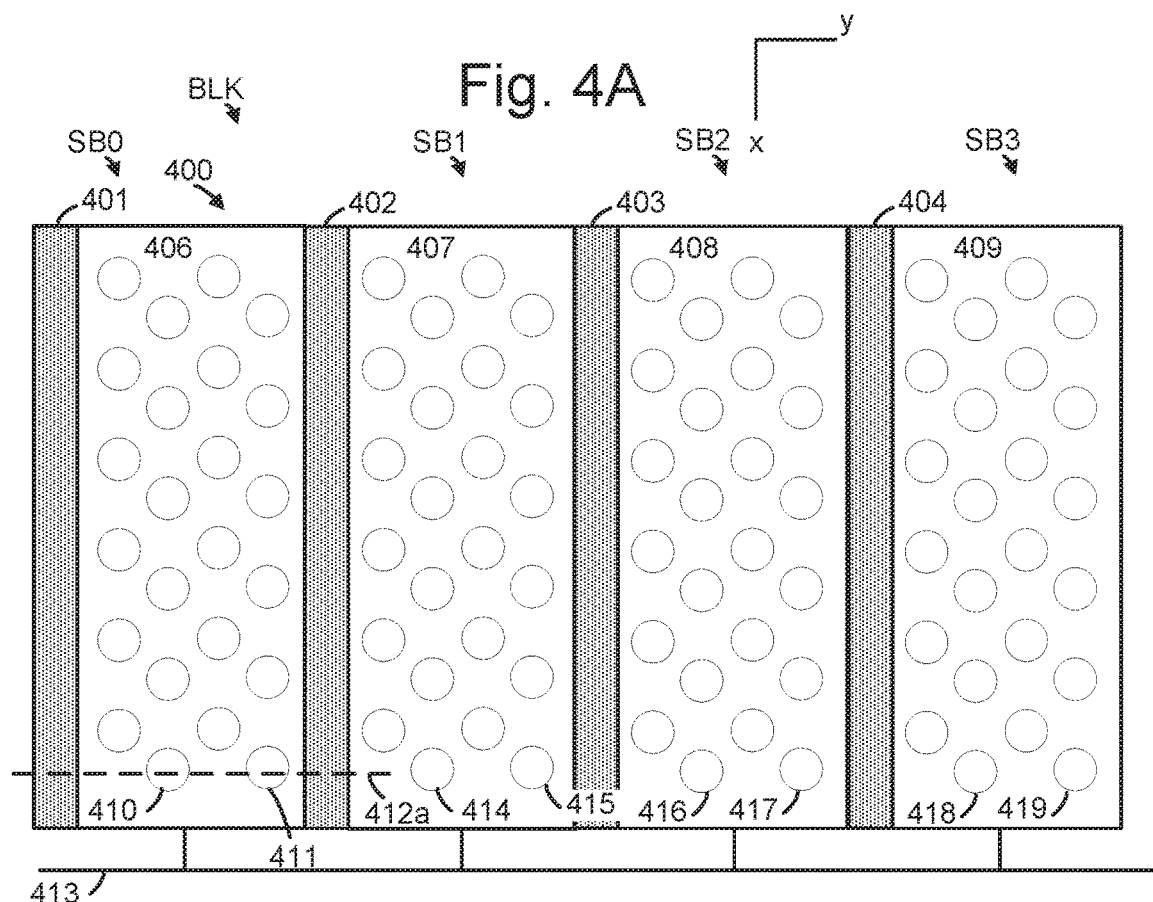
FIG. 4A depicts a top view of an example word line layer of a 3D memory structure, in a straight NAND string embodiment.

FIG. 4A depicts a top view of an example word line layer 400 of a 3D memory structure, in one embodiment. A 3D memory device can comprise a stack of alternating conductive and dielectric layers. Herein, the layers may be referred to as horizontal layers, due to their orientation with respect to the x-y surface of the substrate 301. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. Further, a word line layer in a block can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

FIG. 4A and other Figures are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions 406, 407, 408 and 409 which are each connected by a connector 413. The last region of a word line layer in a block can be connected to a first region of a word line layer in a next block, in one approach. The connector, in turn, is connected to a voltage driver for the word line layer. The region 406 has example memory holes 410 and 411 along a line 412a. The region 407 has example memory holes 414 and 415. The region 408 has example memory holes 416 and 417. The region 409 has example memory holes 418 and 419.

Each circle represents the cross-section of a memory hole at a word line layer or SG layer. Each circle can alternatively represent a memory cell which is provided by the materials in the memory hole and by the adjacent word line layer.

Metal-filled slits 401, 402, 403 and 404 (e.g., metal interconnects) may be located between and adjacent to the edges of the regions 406-409. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device.

Figure 4B:
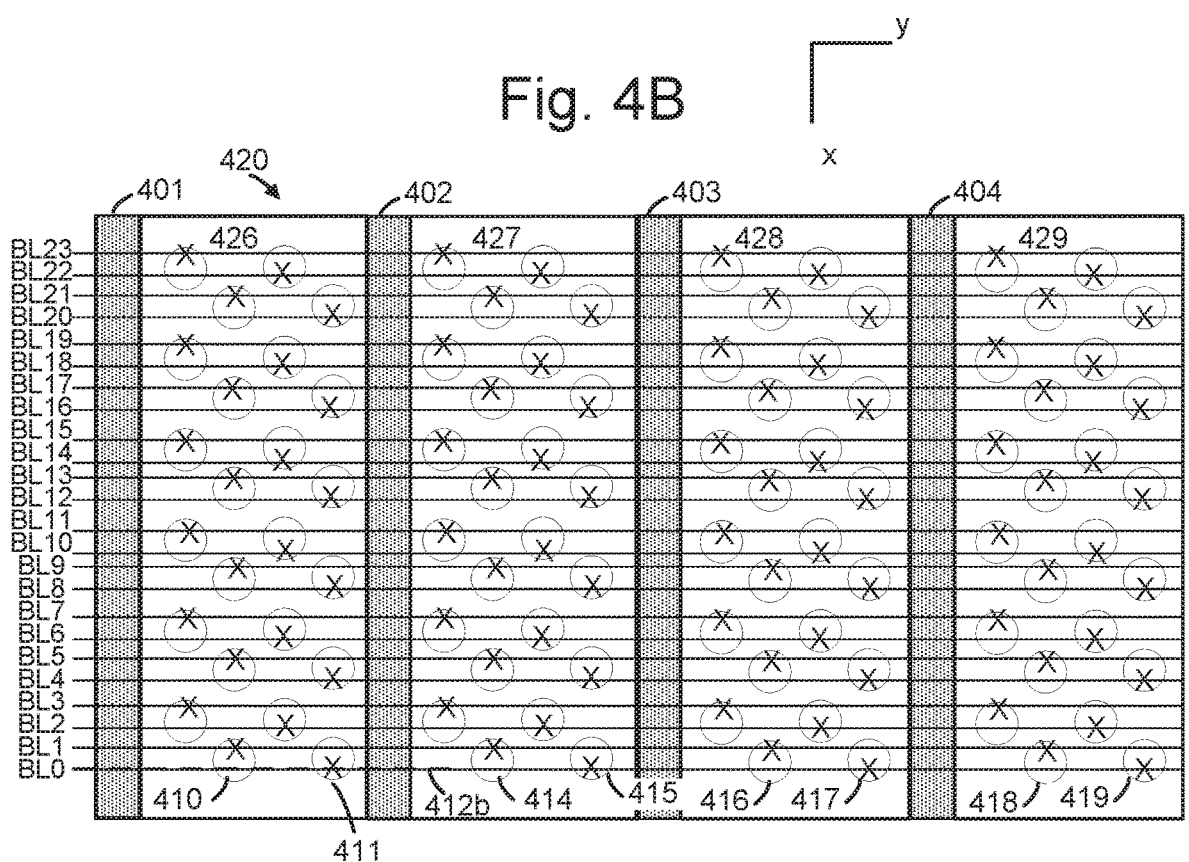
FIG. 4B depicts a top view of an example SGD layer 420, consistent with FIG. 4A.

FIG. 4B depicts a top view of an example SGD layer 420, consistent with FIG. 4A. The SGD layer is divided into regions 426, 427, 428 and 429. Each region can be connected to a different voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region 426 has the example memory holes 410 and 411 along a line 412b which is coincident with a bit line BL0. The region 427 also has the example memory hole 414 which is coincident with a bit line BL1. A number of bit lines extend above the memory holes and are connected to the memory holes as indicated by the "X" symbols. BL0 is connected to a set of memory holes which includes the memory holes 411, 415, 417 and 419. Another example bit line BL1 is connected to a set of memory holes which includes the memory holes 410, 414, 416 and 418. The metal-filled slits 401, 402, 403 and 404 from FIG. 4A are also depicted, as they extend vertically through the stack. The bit lines can be numbered in a sequence BL0-BL23 across the SGD layer 420 in the x-direction. In practice many more bit lines can be used for SGD layer 420.

Different subsets of bit lines are connected to cells in different rows. For example, BL0, BL4, BL8, BL12, BL16 and BL20 are connected to cells in a first row of cells at the right-hand edge of each region. BL2, BL6, BL10, BL14, BL18 and BL22 are connected to cells in an adjacent row of cells, adjacent to the first row at the right-hand edge. BL3, BL7, BL11, BL15, BL19 and BL23 are connected to cells in a first row of cells at the left-hand edge of each region. BL1, BL5, BL9, BL13, BL17 and BL21 are connected to cells in an adjacent row of cells, adjacent to the first row at the left-hand edge.

Figure 4C:
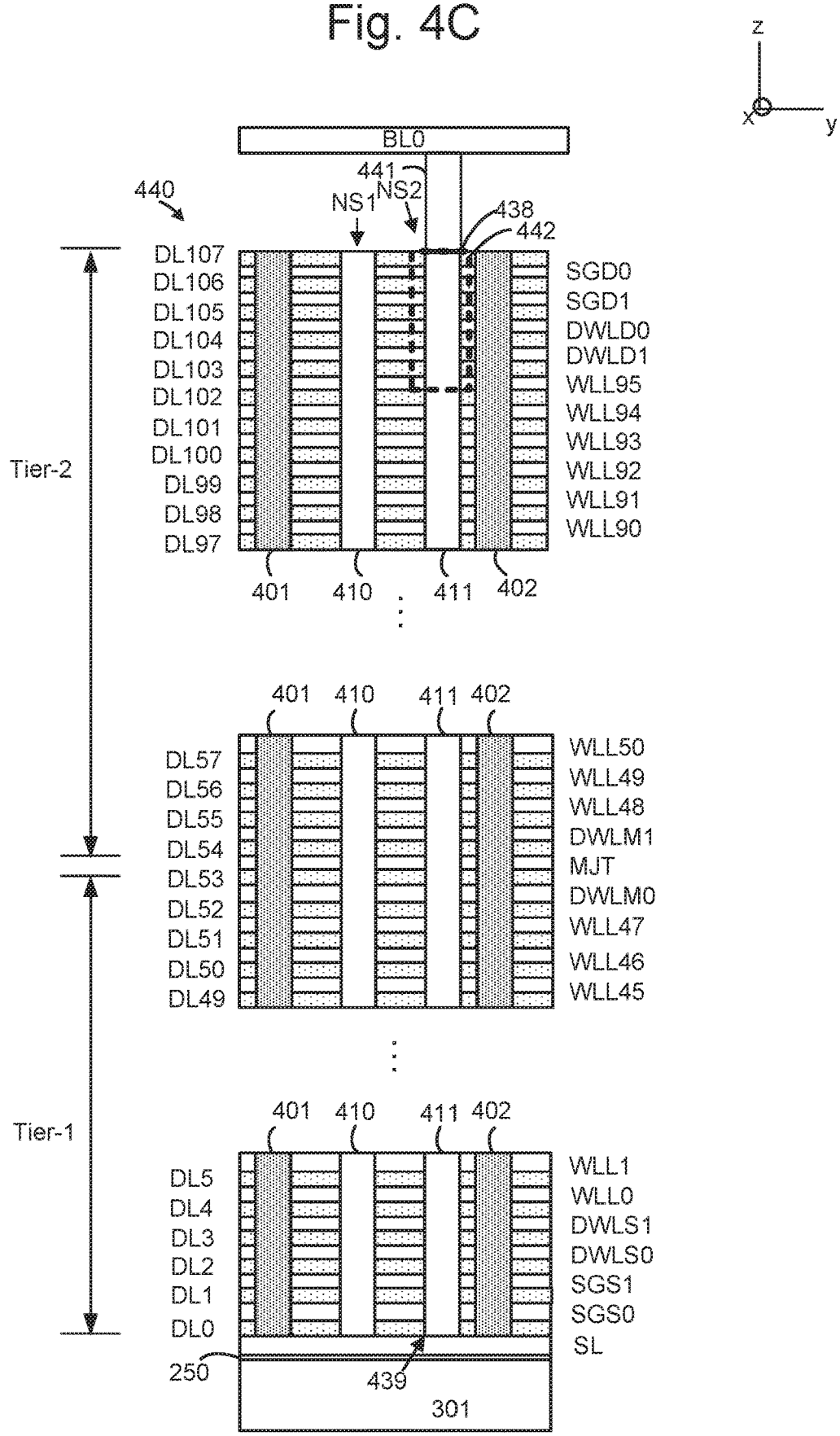
FIG. 4C depicts an embodiment of a stack showing a cross-sectional view along line 412a of FIG. 4A and line 412b of FIG. 4B.

FIG. 4C depicts an embodiment of a stack 440 showing a cross-sectional view along line 412a of FIG. 4A and line 412b of FIG. 4B. Two SGD layers (SGD0, SDG1), two SGS layers (SGS0, SGS1) and six dummy word line layers DWLD0, DWLD1, DWLM1, DWLM0, DWLS0 and DWLS1 are provided, in addition to the data word line layers WLL0-WLL95. Also depicted is a middle junction transistor (MJT) layer. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage.

Columns of memory cells corresponding to NAND strings NS1 and NS2 are depicted in the multi-layer stack. The stack includes a substrate 301, an insulating film 250 on the substrate, and a portion of a source line SL. NS1 has a source-end 439 at a bottom of the stack and a drain-end 438 at a top of the stack. The metal-filled slits 401 and 402 from FIGS. 4A and 4B are also depicted. A portion of the bit line BL0 is also depicted. A conductive via 441 connects the drain-end 438 of NS2 to BL0. Note that NS1 is connected to BL1, but that BL1 is not depicted in FIG. 4C. A region 442 of the stack is shown in greater detail in FIG. 4E.

The stack 440 is divided into two tiers. A middle junction transistor (MJT) layer divides the stack 440 into tier-1 and tier-2. The NAND strings have a tier select gate transistor (or isolation transistor) in the MJT layer, in one embodiment. The tier select gate transistor may be used to electrically isolate a first set of memory cell transistors within the memory string (e.g., corresponding with Tier-1 word lines WLL0-WLL47) from a second set of memory cell transistors within the memory string (e.g., corresponding with the Tier-1 word lines WLL48-WLL95) during a memory operation (e.g., an erase operation or a programming operation).

In another embodiment, the middle junction transistor (MJT) layer is not used to divides the stack 440 into tier-1 and tier-2. Instead, one or more dummy word line layers may be used to divide the stack 440 into tier-1 and tier-2. In this case, one or more dummy memory cell transistors may be used to electrically isolate the first set of memory cell transistors from the second set of memory cell transistors during a memory operation.

The stack 400 may have more than two tiers. For example, the stack 440 may be divided into three, four, or more tiers. Each of the tiers contains at least one data memory cell. There may additional layers similar to the middle junction transistor (MJT) layer in order to divide the stack 400 into the additional tiers. For example, two junction transistor (JT) layers can divide the stack 400 into three tiers, three junction transistor (JT) layers can divide the stack 400 into four tiers, etc.

Figure 4D:
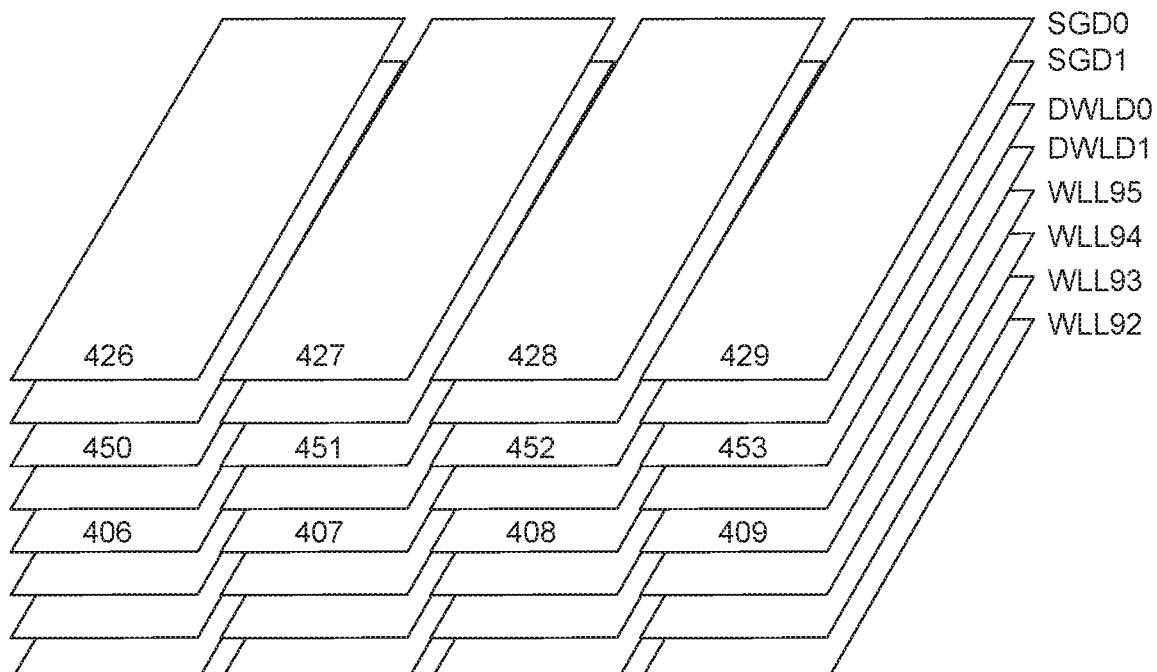
FIG. 4D depicts an alternative view of the select gate layers and word line layers of the stack 440 of FIG. 4C.
Figure 4D:
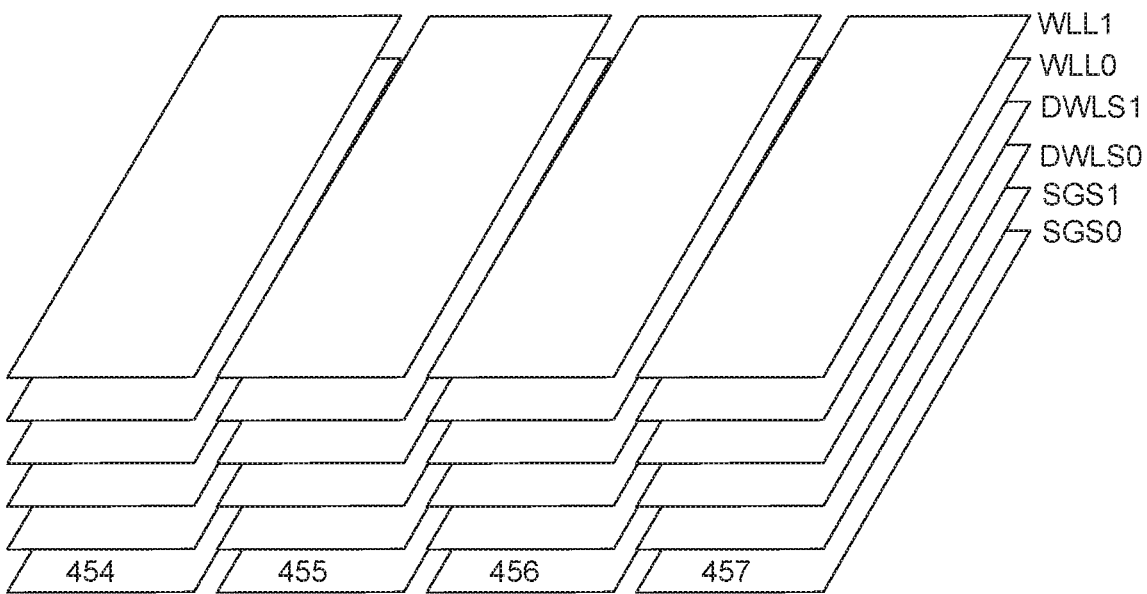

FIG. 4D depicts an alternative view of the SG layers and word line layers of the stack 440 of FIG. 4C. The SGD layers SGD0 and SGD0 (the drain-side SG layers) each includes parallel rows of SG lines associated with the drain-side of a set of NAND strings. For example, SGD0 includes drain-side SG regions 426, 427, 428 and 429, consistent with FIG. 4B.

Below the SGD layers are the drain-side dummy word line layers. Each dummy word line layer represents a word line, in one approach, and is connected to a set of dummy memory cells at a given height in the stack. For example, DWLD0 comprises word line layer regions 450, 451, 452 and 453. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy word line layers are the data word line layers. For example, WLL10 comprises word line layer regions 406, 407, 408 and 409, consistent with FIG. 4A.

Below the data word line layers are the source-side dummy word line layers.

Below the source-side dummy word line layers are the SGS layers. The SGS layers SGS0 and SGS1 (the source-side SG layers) each includes parallel rows of SG lines associated with the source-side of a set of NAND strings. For example, SGS0 includes source-side SG lines 454, 455, 456 and 457. Each SG line can be independently controlled, in one approach. Or, the SG lines can be connected and commonly controlled.

Figure 4E:
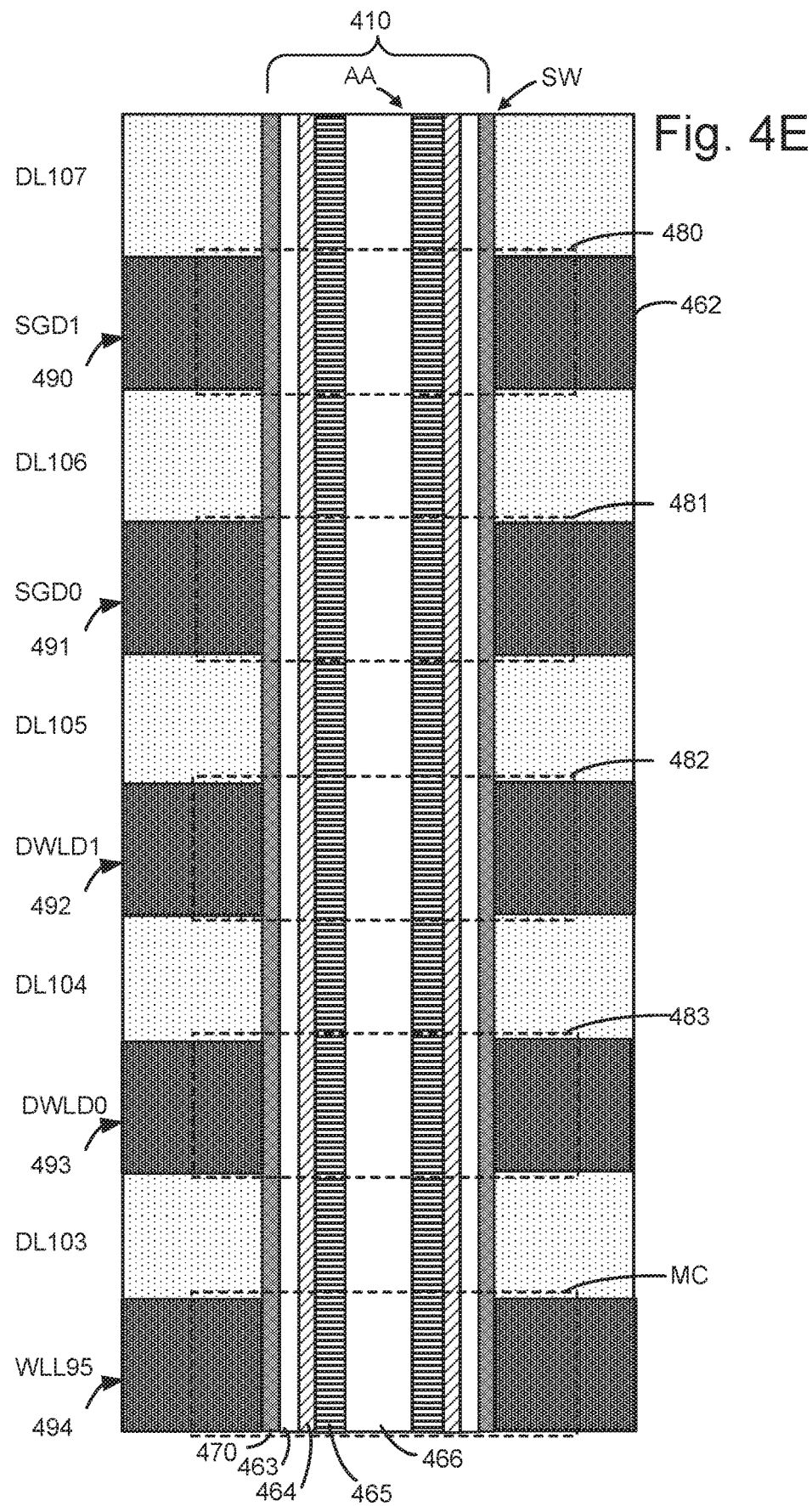
FIG. 4E depicts a view of the region 442 of FIG. 4C.

FIG. 4E depicts a view of the region 442 of FIG. 4C. SGD transistors 480 and 481 are provided above dummy memory cell transistors 482 and 483 and a data memory cell transistor MC. A number of layers can be deposited along the sidewall (SW) of the memory hole 410 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. In FIG. 4E, select transistors 480, 481, and dummy memory cell transistors 482, 483 include the charge trapping layer 463. Thus, the threshold voltage of at least some non-data transistors may also be adjusted by storing or removing electrons from the charge trapping layer 463. It is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

Figure 5:
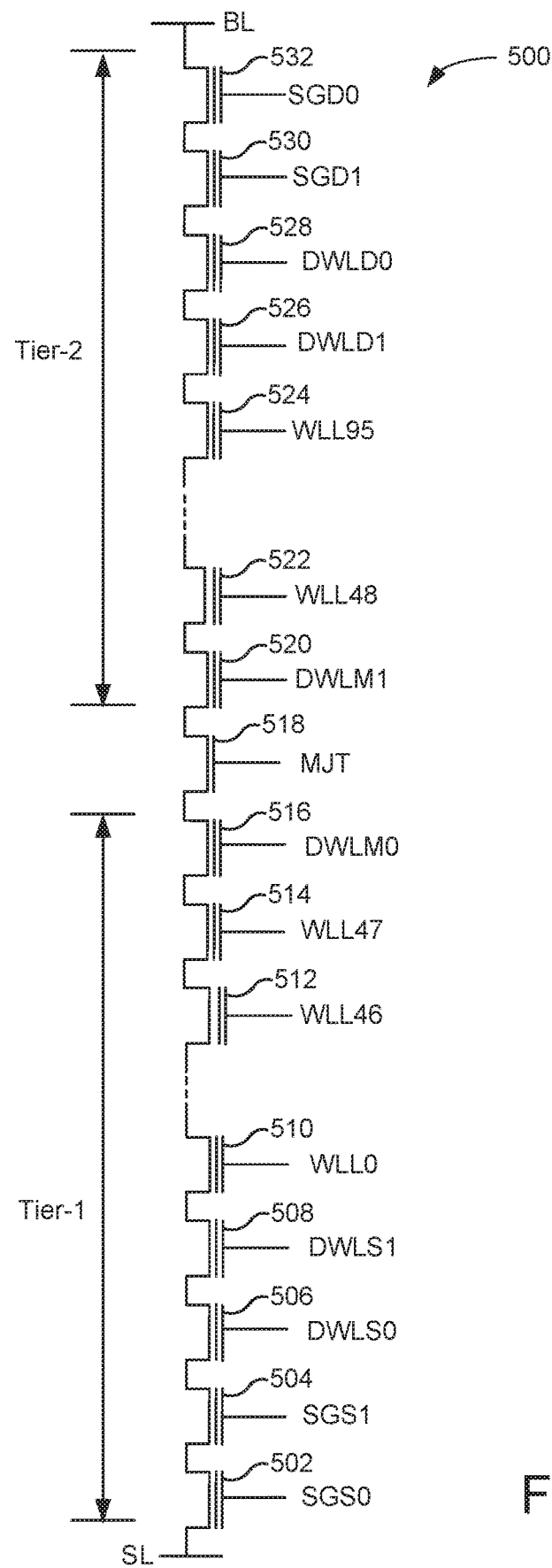
FIG. 5 is a schematic diagram of a NAND string.

FIG. 5 is a schematic diagram of a NAND string 500. The NAND string 500 is consistent with the NAND strings in FIG. 4C. The NAND string 500 comprises a first portion of the NAND string (e.g., corresponding with Tier-1 of memory cell transistors), a second portion of the NAND string (e.g., corresponding with a Tier-2 of memory cell transistors), and a tier select gate transistor 518 arranged between the first portion of the NAND string and the second portion of the NAND string. The first portion of the NAND string 500 includes a first source-side select gate transistor 502 connected to SGS0, a second source-side select gate transistor 504 connected to SGS1, two dummy memory cell transistors 506, 508 connected respectively to DWLS0 and DWLS1, data memory cell transistors 510, 512, 514 connected to word lines WLL0-WLL47, a dummy memory cell transistor 516 connected to dummy word line DWLM0. The second portion of the NAND string 500 includes a dummy memory cell transistor 520 connected to dummy word line DWLM1, data memory cell transistors 522, 524 connected to word lines WLL48-WLL95, two dummy memory cell transistors 526, 528 connected respectively to DWLD0 and DWLD1, a drain-side select gate transistor 530 connected to SGD1, a drain-side select gate transistor 532 connected to SGD0. Drain-side select gate transistor 532 is connected to a bit line (BL). First source-side select gate transistor 502 is connected to a source line (SL).

The tier select gate transistor 518 may be a programmable transistor, such as a floating gate transistor or a charge trap transistor, or a non-programmable transistor, such as an NMOS transistor or a PMOS transistor. The tier select gate transistor 518 may have a transistor channel length that is different from the transistor channel lengths used for the first set of memory cell transistors and/or the second set of memory cell transistors. The channel length may be greater than any of the transistor channel lengths used for the first set of memory cell transistors and the second set of memory cell transistors. For example, the channel length may be three times greater than the transistor channel lengths used for the first set of memory cell transistors and the second set of memory cell transistors.

The tier select gate transistor 518 may electrically isolate the first set of memory cell transistors from the second set of memory cell transistors when the tier select gate transistor 518 is set into a non-conducting state. When a tier select gate transistor is set into a conducting state, then a bit line connected to a drain-side of a NAND string may be electrically connected to a channel formed under memory cell transistors of the lower tier, in one embodiment.

In one embodiment, during a programming operation for data memory cells within Tier-1, the tier select gate transistor 518 may be placed into a conducting state while the data memory cells within Tier-1 are programmed. During a subsequent programming operation for memory cells within Tier-2, the tier select gate transistor 518 may be placed into a non-conducting state while the data memory cells within Tier-2 are programmed. In this case, the channel under the memory cells within Tier-1 may be floated. The tier select gate transistor 518 may comprise an NMOS transistor without a charge trap layer between the channel of the NMOS transistor and the gate of the NMOS transistor. In another embodiment, during an erase operation for memory cells within Tier-2, the tier select gate transistor 518 may be placed into a non-conducting state while the memory cells within the Tier-2 are erased.

Figure 6:
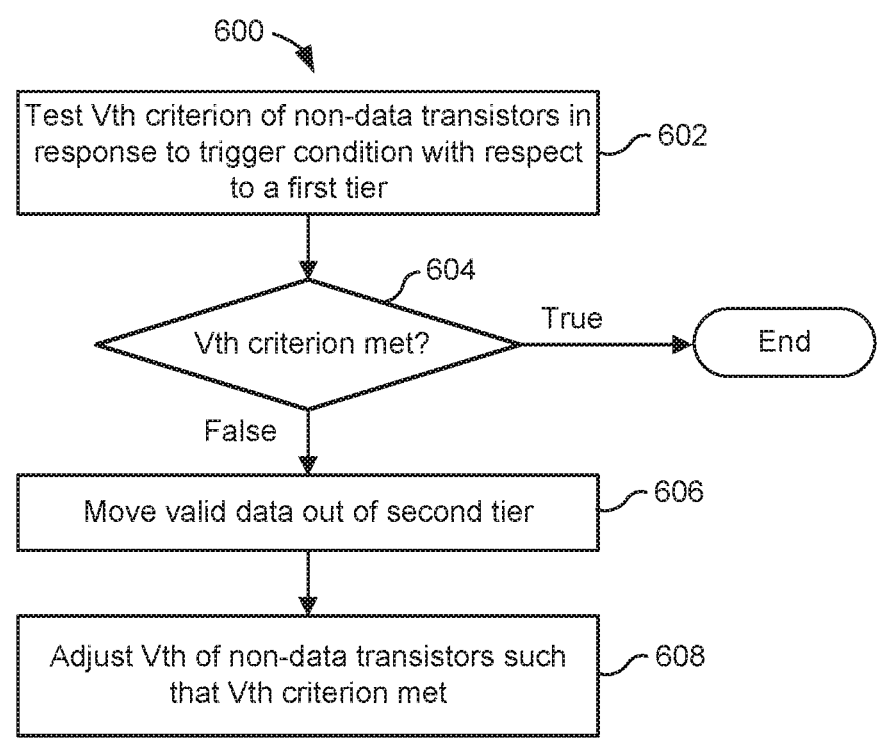
FIG. 6 is a flowchart of one embodiment of a process of maintaining threshold voltages of transistors in a memory device.

FIG. 6 is a flowchart of one embodiment of a process 600 of maintaining threshold voltages of transistors. The process 600 is used to maintain threshold voltages of non-data transistors (e.g., select transistors and/or dummy memory cell transistors) associated with memory cells that reside in a stack in the non-volatile memory, in one embodiment. In one embodiment, the non-data transistors are select transistors associated with groups of memory cells. Each group of memory cells resides on a NAND string which has one or more select transistors, for which threshold voltage maintenance is provided, in one embodiment. The process 600 is used to maintain threshold voltages of non-data transistors (e.g., select transistors and/or dummy memory cell transistors) on a group of NAND strings, in one embodiment. The NAND strings are in a three-dimensional memory array, in one embodiment. The NAND strings are oriented vertically a stack comprising alternating horizontal conductive layers and horizontal dielectric layers, in one embodiment. In one embodiment, the process 600 is performed on a group of NAND strings in a block, such as the block (BLK) depicted in FIGS. 4A and 4B. The process 600 is performed on a group of one or more NAND strings in a sub-block (e.g., SB0, SB1, SB2, SB3 in FIG. 4A.). The process 600 could be performed in parallel on groups of NAND strings in different planes on the same memory die. The process 600 could be performed in parallel on groups of NAND strings in different memory die.

Process 600 is performed by a processor circuit on controller 122, in one embodiment. The processor circuit include one or more of ECC 224, sequencer 226, RAID 228, flash control layer 232, media management layer 238, and/or buffer management/bus control 214, in one embodiment. The processor circuit uses the memory interface 230 to send commands to and receive data from the memory dies 108 in order to maintain threshold voltages of non-data transistors, in one embodiment. For example, process 600 may be performed by state machine 112 and/or controller 122 (or equivalently functioned circuits), in combination with all or a subset of the other circuits depicted in FIG. 1.

Process 600 is performed by a control circuit, in one embodiment. For example, process 600 may be performed by state machine 112 and/or controller 122 (or equivalently functioned circuits), in combination with all or a subset of the other circuits depicted in FIG. 1.

The stack is divided into multiple tiers, in one embodiment. Process 600 will be described with respect to two tiers in the stack, but can be applied to more than two tiers. Reference may be made to FIG. 4C or FIG. 5 to describe process 600; however, process 600 is not limited to the embodiments of FIG. 4C or FIG. 5.

The process 600 may be initiated in response to a trigger condition being met with respect to an erase of a first set of data memory cells in a first tier of the stack. The first tier could be Tier-1 or Tier-2. The trigger condition is based on an erase count of the data memory cells in the first tier, in one embodiment. Typically, all of the data memory cells (in a unit such as sub-block or block) in a given tier are erased prior to programming. Thus, the data memory cells in a given tier undergo what is referred to as erase/program (or program/erase) cycles. Thus, the erase count may also be referred to a program/erase count (or "P/E count"). However, the trigger condition could be based on other factors, such as whether a non-data transistor Vth maintenance check has recently been performed due to a trigger condition being met with respect to an erase of a second set of data memory cells in a second tier of the stack. This can be used to improve performance by reducing un-necessary non-data transistor Vth maintenance checks.

Step 602 includes testing a threshold voltage criterion of the non-data transistors. The threshold voltage criterion includes an allowed Vth range for the non-data transistors at a given layer of the stack, in one embodiment. The allowed Vth range can differ for non-data transistors at different layers of the stack. It is not required that non-data transistors at every level of the stack be tested to comply with the threshold voltage criterion. With respect to FIG. 4C, the tested non-data transistors could include any of the following levels: SGD0, SGD1, DWLD0, DWLD1, DWLM1, MJT, DWLM0, DWLS1, DWLS0, SGS1, SGS0, assuming that the non-data transistors at that level have an adjustable Vth. In one embodiment, non-data transistors at the same level are tested regardless of which tier is to be erased. For example, whether data memory cells in Tier-1 or Tier-2 are to be erased, select transistors at levels SGD0 and SGD1 may be tested.

With respect to FIG. 5, the non-data transistors that are tested in step 602 could include one or more of source-side select gate transistors 502, 504, dummy memory cell transistors 506, 508, 516, 520, 526, 528, drain-side select gate transistors 530, 532. The MJT transistor 518 is also a non-data transistor, but in the example of FIG. 5, does not have a programmable threshold voltage. However, the MJT transistor 518 could have a programmable threshold voltage, in which case, the threshold voltage of MJT transistor 518 could be tested in step 602.

Step 602 tests whether more than an allowed number of non-data transistors at a given level of the stack have a threshold voltage outside of a target range, in one embodiment. Note that it is not required that every non-data transistor at a given level of the stack have its Vth measured. For example, a sample of 1000 out of 10,000 non-data transistors at the SGD0 level might be tested. The allowed number is not required to be the same for each level of the stack. The target range is not required to be the same for each level of the stack.

Figure 7A:
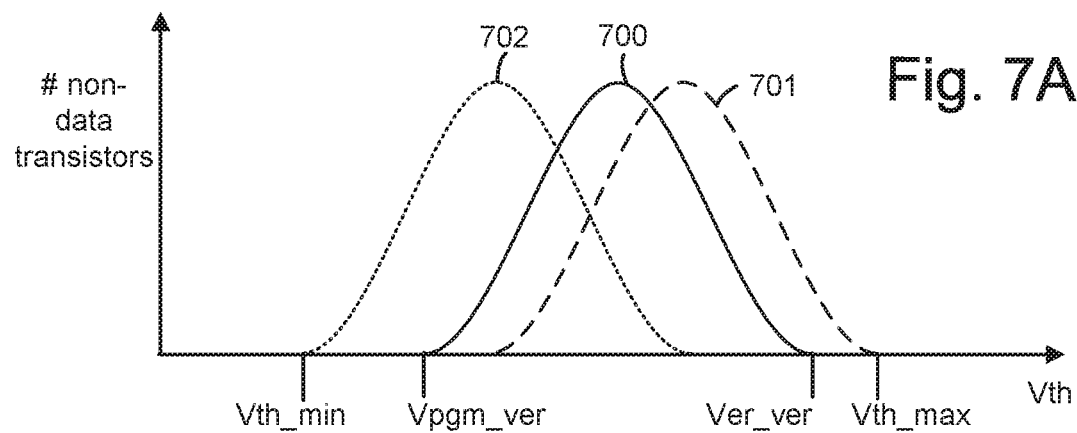
FIGS. 7A-7C, which show example threshold voltage distributions of non-data transistors.
Figure 7B:
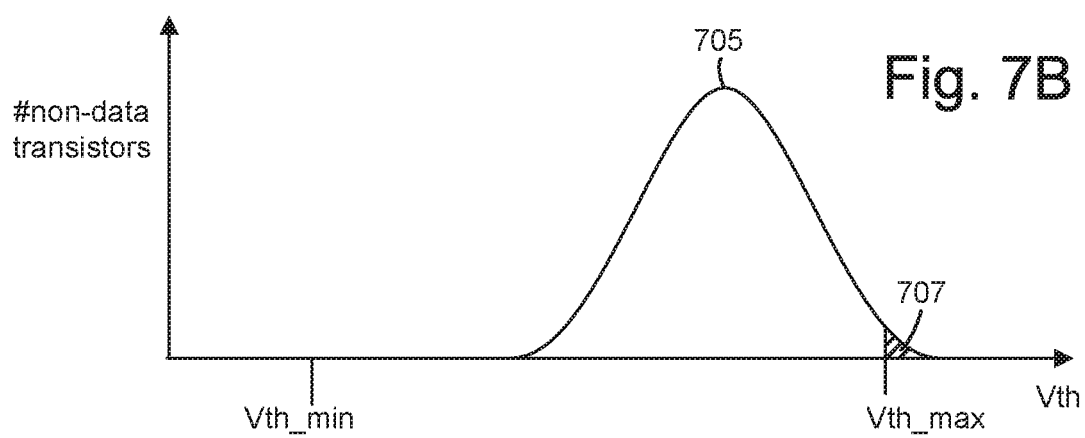
Figure 7C:
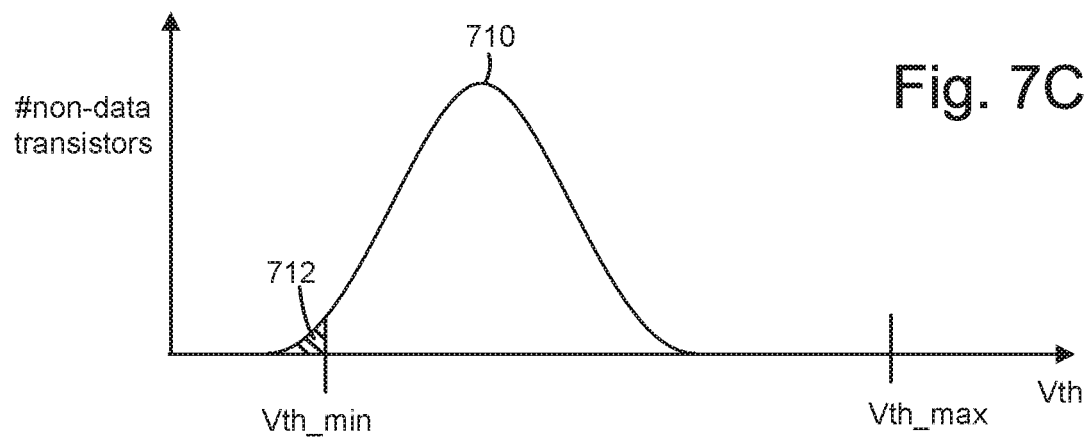

FIGS. 7A-7C, which show example Vth distributions of non-data transistors, will now be discussed to illustrate embodiments of testing a threshold voltage criterion of a subset of non-data transistors. The Vth distributions are for non-data transistors at the same level of the stack for some group of NAND strings, in one embodiment. The group of NAND strings could be in a sub-block, block, or some other unit.

FIG. 7A depicts a plot of a Vth distribution, showing an initial distribution 700, a distribution after read disturb 701, and a distribution after data retention loss 702. In FIG. 7A, the vertical axis represents a count of non-data transistors, on a log scale, and the horizontal axis represents Vth in Volts. Vpgm_ver represents a verify voltage which may be used to increase (e.g., program) a non-data transistor to the initial distribution, such as at the time of manufacture or during the lifetime of the memory device. Ver_ver represents a verify voltage which may be used to decrease (e.g., erase) a non-data transistor to the initial distribution, such as at the time of manufacture or during the lifetime of the memory device. The term "program" is being used in this context to indicate increasing the Vth of a non-data transistor. The term "erase" is being used in this context to indicate decreasing the Vth of a non-data transistor. Subsequently, the Vth distribution can shift higher or lower. The shape, including the width, of the distribution, can also change, but is typically Gaussian, having a pronounced peak with sloping side. Vth_min and Vth_max define an acceptable range for the Vth distribution for a subset of non-data transistor, in one embodiment.

FIG. 7B depicts a plot of a non-data transistor Vth distribution 705 which has an upper portion that exceeds a maximum allowable voltage, Vth_max. Region 707 of the Vth distribution 705 represents non-data transistors for which Vth>Vth_max. In one embodiment, the control circuit counts non-data transistors with a Vth above Vth_max. The control circuit may stop counting if the number exceeds the number that are allowed to have a Vth above Vth_max. In one embodiment, a pre-determined number of non-data transistors are allowed to have a Vth above Vth_max. For example, a maximum of 16 non-data transistors might be allowed to have a Vth above Vth_max, in one embodiment.

FIG. 7C depicts a plot of a non-data transistor Vth distribution 710 which has a lower portion below a minimum allowable voltage, Vth_min. Region 712 of the Vth distribution 710 represents non-data transistors for which Vth<Vth_min. In one embodiment, the control circuit counts how many non-data transistors have a Vth below Vth_min. The control circuit may stop counting if the number exceeds the number that are allowed to have a Vth below Vth_min. In one embodiment, a pre-determined number of non-data transistors are allowed to have a Vth below Vth_min. For example, a maximum of 16 non-data transistors in the subset might be allowed to have a Vth below Vth_min, in one embodiment.

In one embodiment, step 602 includes testing whether a threshold voltage distribution of a set of select transistors in a group of NAND strings oriented vertically in a stack in a three-dimensional memory array is outside of a target range. A threshold voltage distribution of a set of non-data transistors (e.g., select transistors) is outside of a target range if more than an allowed number of non-data transistors have a Vth outside of the target range. A threshold voltage distribution of a set of non-data transistors (e.g., select transistors) is within a target range if no more than the allowed number of non-data transistors have a Vth outside of the target range.

Returning again to the discussion of FIG. 6, in step 604, the control circuit determines whether the Vth criterion for the non-data transistors is met. In one embodiment, the Vth criterion is met if, for each level of the stack that is tested, no more than an allowed number of non-data transistors for a given level have a Vth outside of a target range for that level. For example, the Vth criterion might be met if no more than 16 transistors at the SGD0 level had a Vth outside of a target range for the SGD0 level and no more than 16 transistors at the SGD1 level had a Vth outside of a target range for the SGD1 level. The Vth criterion can be based on a test of any combination of levels having non-data transistors (e.g., SGD0, SGD1, DWLD0, DWLD1, DWLM1, DWLM0, DWLS1, DWLS0, SGS1, SGS0). As noted above, it is not required that all levels having non-data transistors be tested. For example, one option is to test select transistors, but not test dummy memory cell transistors.

A target range has an upper Vth and a lower Vth, in one embodiment. Thus, the range contains a window of allowed Vths, in one embodiment. As one example, the target range may range from Vth_min to Vth_max. A target range has a lower Vth but is unbounded on the upper end, in one embodiment. As one example, the control circuit may determine whether more than an allowed number of non-data transistors have a Vth below Vth_min, but not consider whether non-data transistors have a Vth above Vth_max. A target range has an upper Vth but is unbounded on the lower end, in one embodiment. As one example, the control circuit may determine whether more than an allowed number of non-data transistors have a Vth above Vth_max, but not consider whether non-data transistors have a Vth below Vth_min.

If the Vth criterion is met, then the process 600 ends, in one embodiment. If the Vth criterion is not met, then the process continues at step 606. Step 606 includes moving valid data out of the second set of data memory cells in the second tier to another location. The other location could be any location other than the second set of data memory cells in the second tier of the stack. The other location may be in another group NAND strings in the memory device. The other group of NAND strings could be in a different sub-block, a different block, a different plane, or a different memory die. By moving the valid data out of the second set of data memory cells, the data is protected from possible damage or loss that could result by remaining in the second set of data memory cells.

Step 608 includes adjusting Vths of the non-data transistors such that the Vth criterion is met for the non-data transistors. It is not required that the Vth of every non-data transistor be altered. For example, only non-data transistors having a Vth outside of the target range have their Vth are adjusted, in one embodiment. However, even non-data transistors having a Vth within the target range could have their Vth adjusted to, for example, tighten the Vth distribution.

Figure 9:
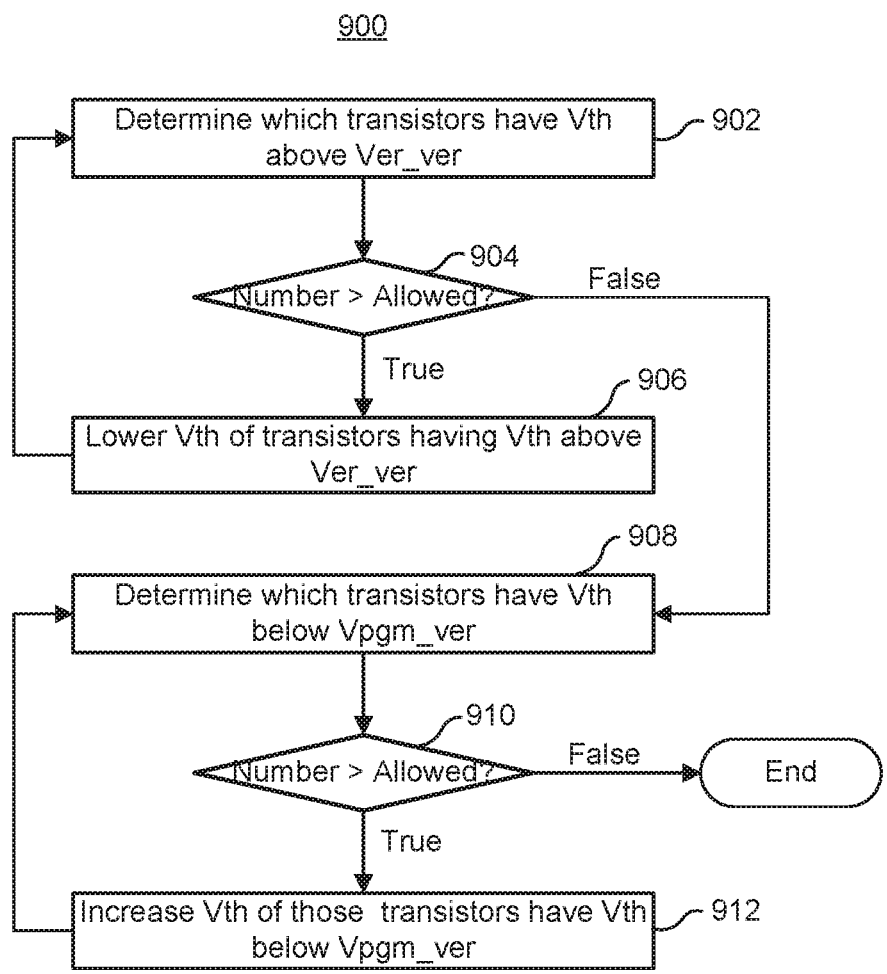
FIG. 9 is a flowchart of one embodiment of a process of adjusting threshold voltages of non-data transistors.

Step 608 can be performed on non-data transistors at a level of the tier even if that level was not tested. Step 608 can be performed on non-data transistors at a level for which no more than an allowed number of non-data transistors had a Vth outside of a target range. This can be used to tighten the Vth distribution. FIG. 9 depicts one embodiment of adjusting Vths of the non-data transistors such that the Vth criterion is met for the non-data transistors. If the Vth criterion is not met after the attempt to adjust the Vths of the non-data transistors, the group of NAND strings can be marked such that they are no longer used.

Figure 8:
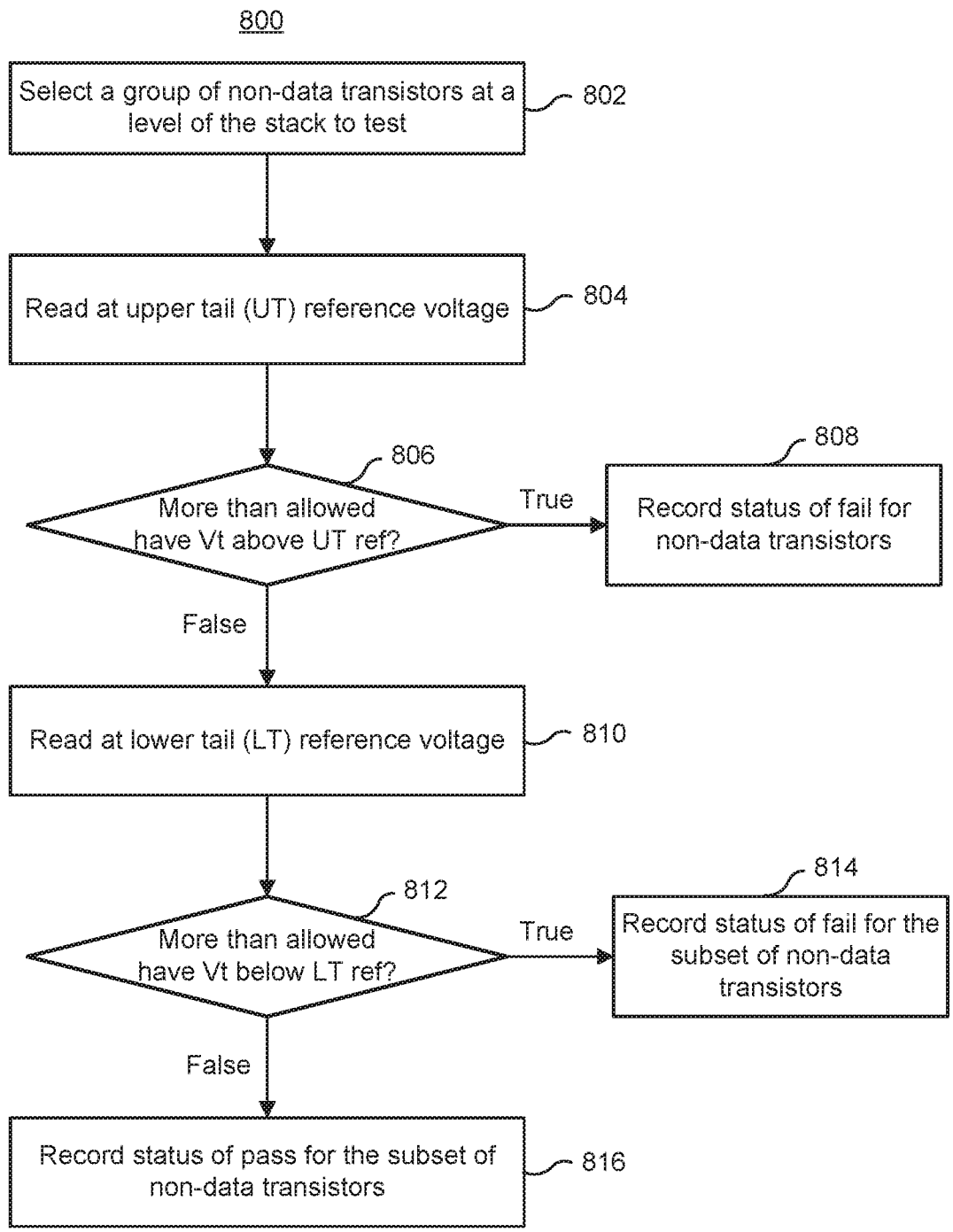
FIG. 8 is a flowchart of one embodiment of a process of testing a threshold voltage criterion of a non-data transistors.

FIG. 8 is a flowchart of one embodiment of a process 800 of testing threshold voltages of non-data transistors at a given level of the stack. The process 800 may be used in step 602 of process 600. The process 800 may be repeated for each level of non-data transistors that is to be tested in step 602. Note that the process 800 is performed with respect to some group of NAND strings, such as a sub-block or block (see FIGS. 4A and 4B). The process 800 can be performed separately, but in parallel, with respect to groups of NAND strings in different memory dies or with respect to groups of NAND strings in different planes on the same memory die.

Step 802 includes selecting a group of the non-data transistors at the level. There may be many non-data transistors at the level (with respect to the group of NAND strings). For example, with reference to FIG. 4A, there may be many (e.g., thousands) of non-data transistors in a sub-block (e.g., SB0, SB1, SB2, SB3) at a given level of the stack. In one embodiment, all non-data transistors in the subset are tested in step 802. For example, every select transistor at level SGD0 may be selected. However, it is not required that every non-data transistor in the subset be selected in step 802.

Step 804 includes reading (or sensing) at an upper tail (UT) reference voltage. For example, the non-data transistors may be sensed at Vth_max. In one embodiment, Vth_max is applied to control terminals of the selected non-data transistors while a "read pass" voltage is applied to all other transistors on the NAND strings. The read pass is a voltage that is expected to be greater than the Vth of all other transistors, in one embodiment.

Step 806 is a determination of whether more than an allowed number of non-data transistors have a Vth above the UT reference level. The allowed number is at least zero. As one example, the allowed number is 16 for a sub-block. The allowed number depends on how many non-data transistors were selected for testing, in one embodiment.

Step 808 is performed when more than the allowed number of non-data transistors have a Vth above the UT reference level. In step 808, a status of "fail" is recorded for the non-data transistors at this level of the stack. The process 800 may then end. Note that process 800 may be repeated for non-data transistors (in the group of NAND strings for which Vth maintenance is being performed) at a different level of the stack. Also note that the status information (and other status information stored in process 800) may be used in step 604 of process 600.

Step 810 is performed if the allowed number or fewer non-data transistors have a Vth above the UT reference level. Step 810 includes reading (or sensing) at a lower tail (LT) reference voltage. For example, the non-data transistors may be sensed at Vth_min. In one embodiment, Vth_min is applied to control terminals of the selected non-data transistors while a "read pass" voltage is applied to all other transistors on the NAND strings. The read pass is a voltage that is expected to be greater than the Vth of all other transistors on the NAND strings, in one embodiment.

Step 812 is a determination of whether more than an allowed number of non-data transistors have a Vth below the LT reference level. The allowed number is at least zero. The allowed number depends on how many non-data transistors were selected for testing, in one embodiment. The allowed number could be the same or different as the allowed number for the UT reference level.

Step 814 is performed when more than the allowed number of non-data transistors have a Vth below the LT reference level. In step 814, a status of "fail" is recorded for the non-data transistors at this level of the stack. The process 800 may then end.

Step 816 is performed if the allowed number or fewer non-data transistors have a Vth below the LT reference level. In step 816, a status of "pass" is recorded for the non-data transistors at this level of the stack. The process 800 may then end. Note that process 800 may be repeated for non-data transistors (in the group of NAND strings for which Vth maintenance is being performed) at a different level of the stack.

Many variations of process 800 are possible. In one embodiment, the upper tail is tested, but the lower tail is not. Thus, steps 810, 812, and 814 are omitted, in one embodiment. In one embodiment, the lower tail is tested, but the upper tail is not. Thus, steps 804, 806, and 808 are omitted, in one embodiment. Note that process 800 can be performed with respect to memory cells arranged other than in NAND strings. In one embodiment, process 800 is used to maintain threshold voltages of select transistors for groups of memory cells in a stack in a three-dimensional memory array. Each group of memory cells has a select transistor at each end of the group, which may be used to select that group.

Another variation is to test non-data transistors at two or more levels of the stack at the same time. For example, the drain side select transistors at levels SGD0 and SGD1 might be tested at the same time. In this case, the operation of the drain side select transistors can be treated as a unit. In other words, the test may be based on whether a current is conducted by pair of non-data transistors. During step 804 the UT reference voltage may be applied to the control gates of the drain side select transistors at both levels SGD0 and SGD1. With respect to NAND string 500 in FIG. 5, a significant current will be conducted (and will be present in BL) only if both drain side select transistors have a Vth below the UT reference voltage. Thus, if a significant current is not conducted, this indicates that at least one of the drain side select transistors has a Vth above the UT reference voltage. Thus, a status of fail is recorded in step 808. During step 810, the LT reference voltage may be applied to the control gates of the drain side select transistors at both levels SGD0 and SGD1. A significant current will be conducted (and will be present in BL) only if both drain side select transistors have a Vth below the LT reference voltage. If either drain side select transistor has a Vth above the drain side select transistors, then a significant current is not conducted. Thus, if a significant current is not conducted, a status of pass is recorded in step 816.

FIG. 9 is a flowchart of one embodiment of a process 900 of adjusting Vths of non-data transistors. Process 900 is one embodiment of step 608 of process 600. Process 900 will be described with reference to the reference voltages in FIG. 7A, but is not limited to that example. Process 900 may be performed separately on non-data transistors at each level of the stack.

Step 902 includes a determination of which non-data transistors have a Vth above Ver_ver. Ver_ver may be lower than Vth_max, in which case some non-data transistors having a Vth below Vth_max can have their Vths adjusted downward to tighten the Vth distribution. However, an alternative is to determine which non-data transistors have a Vth above Vth_max. This determination could be made based on the record created in one embodiment of process 800. Another alternative is to determine which non-data transistors have a Vth above a specific level that is between Ver_ver and Vth_max. Note that Ver_ver and Vth_max are equal, in one embodiment. Also, note that Ver_ver could be much lower than depicted in FIG. 8A. For example, Ver_ver could be lower than Vsg_pgm or even lower than Vth_min. In this case, the goal may be to create a new Vth distribution that is significantly lower than the target Vth distribution.

Step 904 is a determination of whether the number of non-data transistors having a Vth above Ver_ver (or another reference level tested in step 902) is more than an allowed number. This allowed number could be the same or different than the allowed number of step 806 of process 800.

If more than the allowed number of non-data transistors have a Vth above Ver_ver (step 904=True), then step 906 is performed. Step 906 is to lower the Vth of transistors having a Vth above Ver_ver. Step 906 may include performing an erase operation on the non-data transistors to lower the Vth. Then, step 902 is performed to verify whether the Vth of the non-data transistors has been lowered sufficiently. When it is determined that the number of non-data transistors having a Vth above Ver_ver is not more than the allowed number, step 908 is performed. Note that there can be a limit as to how many times step 906 is performed. If too many non-data transistors still have a Vth above Ver_ver, the process 900 may end with a status of failure. In this case, the group of NAND strings having the non-data transistors may be marked as invalid for further use.

Step 908 includes a determination of which non-data transistors have a Vth below Vpgm_ver. Vpgm_ver may be greater than Vth_min, in which case some non-data transistors having a Vth above Vth_min can have their Vths adjusted upward to tighten the Vth distribution. However, an alternative is to determine which non-data transistors have a Vth below Vth_min. This determination could be made based on the record created in one embodiment of process 800. Another alternative is to determine which non-data transistors have a Vth below a specific level that is between Vpgm_ver and Vth_min. Note that Vpgm_ver and Vth_min are equal, in one embodiment.

Step 910 is a determination of whether the number of non-data transistors having a Vth below Vpgm_ver (or another reference level tested in step 908) is more than an allowed number. This allowed number could be the same or different than the allowed number of step 812 of process 800.

If more than the allowed number of non-data transistors have a Vth below Vpgm_ver (step 910=True), then step 912 is performed. Step 912 is to increase the Vth of transistors having a Vth below Vpgm_ver. Step 912 may include performing a program operation on the non-data transistors to increase the Vth. Then, step 908 is performed to verify whether the Vth of the non-data transistors has been increased sufficiently. When it is determined that the number of non-data transistors having a Vth below Vpgm_ver is not more than the allowed number, the process ends. Note that there can be a limit as to how many times step 908 is performed. If too many non-data transistors still have a Vth below Vpgm_ver, the process 900 may end with a status of failure. In this case, the group of NAND strings having the non-data transistors may be marked as invalid for further use.

Figure 10:
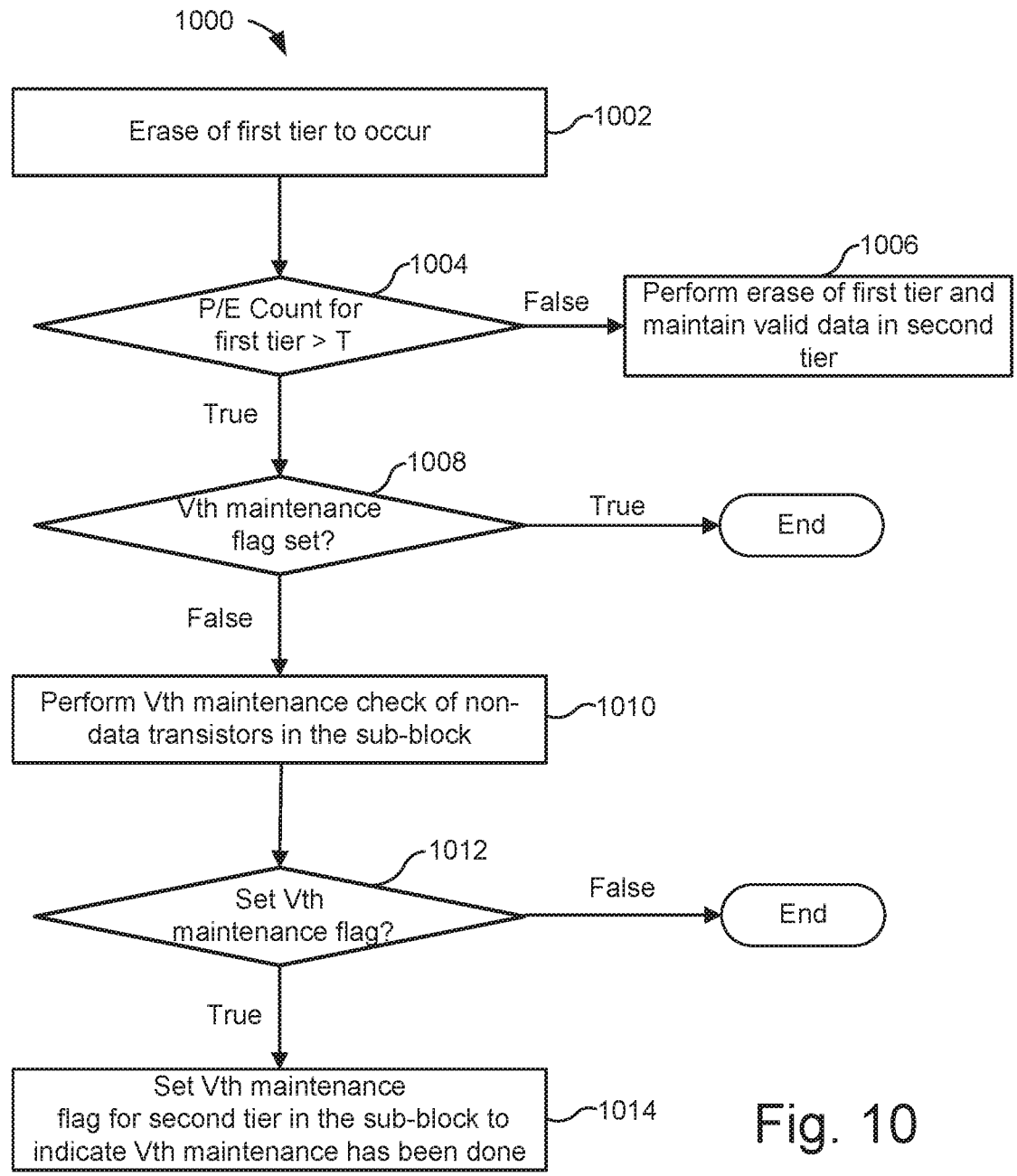
FIG. 10 is a flowchart of one embodiment of a process of performing threshold voltage maintenance of non-data transistors in a non-volatile storage device.

FIG. 10 is a flowchart of one embodiment of a process 1000 of performing Vth maintenance of non-data transistors in a non-volatile storage device. Process 1000 refers to an erase of a sub-block. In process 1000, the control circuit is able to erase memory cells (in a selected sub-block) in one tier of the stack while leaving valid data on memory cells (in selected sub-block) in another tier. The sub-block is one of SB0, SB1, SB2, or SB3, in one embodiment. Note that process 1000 could be used to erase all the sub-blocks in the block (BLK) in FIG. 4A at the same time. Also, process 1000 could be performed in parallel to erase blocks in different planes and/or different memory die.

Step 1002 is an indication that an erase of a first set of data memory cells in a first tier of the stack is about to occur. The erase is to leave valid data in a second set of data memory cells in a second tier of the stack. This erase is of data memory cells of a group of NAND strings, where the data memory cells reside in a selected tier of the stack, in one embodiment. This erase is for a selected tier in a selected sub-block, in one embodiment. This erase is for a selected tier in a selected block, in one embodiment. The flash control layer 232 could determine that the tier should be erased because the data in the selected tier is no longer valid, as one example.

Step 1004 is determination of whether a program/erase (P/E) count for the first set of data memory cells in the first tier is greater than a threshold (T) number. The P/E count could be stored in spare memory cells that are associated with the first set of data memory cells. For example, the spare memory cell could be in the same block or sub-block as the first set of data memory cells. If the P/E count is not greater than the threshold, the erase of the memory cells in the first tier is performed while maintaining valid data in the second set of data memory cells in the second tier, in step 1006. Process 1000 may then end. If the P/E count is greater than the threshold (step 1004=True), then step 1008 is performed. Note that if the P/E count is compared to a fixed threshold (e.g., 10,000), then the P/E count may be re-set to 1 after going over 10,000 for the purpose of this comparison.

In step 1008, the control circuit determines whether a Vth maintenance flag for the first tier is set. The Vth maintenance flag is set to indicate that Vth maintenance was recently performed for the first set of data memory cells in the first tier. Note that a single Vth maintenance flag can be used for more than one sub-block when multiple sub-blocks are typically erased together. For example, a single Vth maintenance flag may be used for the block in FIG. 4A to represent the Vth maintenance status of each of the sub-blocks. The Vth maintenance flag can be any information that is stored in non-transitory storage. The Vth maintenance flag could be stored in a spare memory cell that is associated with the first set of data memory cells. For example, the spare memory cell could be in the same block or sub-block as the first set of data memory cells.

If the Vth maintenance flag is set, then the process ends without performing Vth maintenance. This avoids performing Vth maintenance too frequently. If the Vth maintenance flag is not set, then the control circuit performs Vth maintenance in step 1010. In one embodiment, process 600 is performed. In one embodiment, Vth maintenance is performed on the same subsets of non-data transistors regardless of which tier is to be erased.

Step 1012 includes a determination of whether to set a Vth maintenance flag for the second tier. The control circuit set the Vth maintenance flag in step 1014 upon a determination that the Vth maintenance flag should be set. If the Vth maintenance flag is not to be set, then the process may end. In one embodiment, the control circuit checks a P/E count for the second tier and sets the Vth maintenance flag if the P/E count is relatively close to the threshold that would otherwise trigger the Vth maintenance.

The Vth maintenance flag may be checked in step 1008 when process 1000 is performed for the tier-2, in one embodiment. The following example will be used to illustrate. Tier-1 and Tier-2 each have the same threshold (T) for step 1004. When process 1000 is performed for Tier 1, the P/E count for Tier 1 is over the threshold (such that step 1008 will be performed). At this time, the P/E count for Tier 2 is below, but close to, the threshold. For example, the threshold might be 10,000 with the P/E count for Tier-2 being 9990. After tier-2 is erased a few more times, the check of step 1004 will be true. However, because the Vth maintenance flag is set, the Vth maintenance will not be performed for this sub-block despite the P/E count having gone over the threshold (T). Therefore, over-use of the Vth maintenance is avoided.

A first embodiment disclosed herein comprises apparatus comprising: a memory interface configured to be connected to non-volatile memory; and a processor circuit connected to the memory interface. The processor circuit is configured to test a threshold voltage criterion of non-data transistors associated with memory cells that reside in a stack in the non-volatile memory. The test is in response to a trigger condition being met with respect to an erase of a first set of data memory cells that reside in a first tier of the stack. The memory cells include a second set of data memory cells that reside in a second tier of the stack. The processor circuit is configured to move valid data out of the second set of data memory cells to another location in the non-volatile memory in response to a determination that the threshold voltage criterion is not met. The processor circuit is configured to adjust threshold voltages of the non-data transistors after moving the valid data out of the second set of data memory cells to the other location such that the threshold voltage criterion is met for the non-data transistors.

In a second embodiment and in furtherance of the first embodiment, the trigger condition is based on a count of a number of erases of the first set of data memory cells. The processor circuit is further configured to erase the first set of data memory cells while maintaining valid data in the second set of data memory cells when the trigger condition is not met.

In a third embodiment and in furtherance of the second embodiment, the trigger condition is further based on whether the threshold voltage criterion of the non-data transistors has been tested in response to an erase of the second set of data memory cells.

In a fourth embodiment and in furtherance of the second embodiment, the processor circuit is further configured to store information that indicates that the threshold voltage criterion of the non-data transistors has been tested in response to the trigger condition being met with respect to the erase of the first set of data memory cells. The control circuit is further configured to skip a test of the threshold voltage criterion of the non-data transistors when a count of a number of erases of the second set of data memory cells reaches a threshold that indicates the test should otherwise be performed if the stored information indicates that the threshold voltage criterion of the non-data transistors has been tested in response to the trigger condition being met with respect to the erase of the first set of data memory cells.

In a fifth embodiment and in furtherance of the any of the first to fourth embodiments, the memory cells are part of a group of NAND strings. The apparatus further comprises a plurality of bit lines. The non-data transistors comprise a select transistor on each NAND string connected to one of the bit lines. Each select transistor has a control terminal. The apparatus further comprises a select line connected to the control terminal of each select transistor. To test the threshold voltage criterion, the control circuit is further configured to determine whether more than an allowed number of the select transistors have a threshold voltage outside of a target range.

In a sixth embodiment and in furtherance of the any of the first to fourth embodiments, the memory cells are part of a group of NAND strings. The apparatus further comprises a source line. The non-data transistors comprise a select transistor on each NAND string connected to the source line. Each select transistor has a control terminal. The apparatus further comprises a select line connected to the control terminal of each select transistor. To test the threshold voltage criterion the control circuit is further configured to determine whether more than an allowed number of the select transistors have a threshold voltage outside of a target range.

In a seventh embodiment and in furtherance of the any of the first to sixth embodiments, the memory cells are part of a group of NAND strings. The non-data transistors comprise a dummy memory cell transistor on each NAND string. To test the threshold voltage criterion, the control circuit is further configured to determine whether more than an allowed number of the dummy memory cell transistors have a threshold voltage outside of a target range.

In an eighth embodiment and in furtherance of the any of the first to seventh embodiments, the memory cells are part of a group of NAND strings. The non-data transistors comprise a first select transistor at a first end of each NAND string and a second select transistor at a second end of each NAND string. The first set of data memory cells is arranged between the first select transistor and the second set of data memory cells. The second set of data memory cells is arranged between the first set of data memory cells and the second select transistor.

In a ninth embodiment and in furtherance of the eighth embodiment, the data transistors further comprise a third set of data memory cells arranged between the second set of data memory cells and the second select transistor. The control circuit is further configured to move valid data out of the third set of data memory cells to another location in response to the determination that the threshold voltage criterion is not met and prior to adjusting the threshold voltages of the non-data transistors such that the threshold voltage criterion is met.

One embodiment includes a method of operating non-volatile storage. The method comprises testing whether a threshold voltage distribution of a set of select transistors for groups of memory cells in a stack in a three-dimensional memory array is outside of a target range. Each group of memory cells comprises a first set of data memory cells that reside in a first tier of the stack and a second set of data memory cells that reside in a second tier of the stack. The testing is in response to a program/erase count of the first sets of data memory cells exceeding a threshold. The method also includes moving valid data out of the second sets of data memory cells to another location in response to a determination that the threshold voltage distribution is outside of the target range. The method also includes adjusting threshold voltages of the set of select transistors after moving the valid data out of the second sets of data memory cells to the other location such that the threshold voltage distribution is within the target range.

One embodiment includes a non-volatile memory device comprising a three-dimensional memory array comprising groups memory cells, a first select transistor at a first end of each group, and a second select transistor at a second end of each group. Each group comprises a first set of data memory cells and a second set of data memory cells. The first set of data memory cells is arranged between the first select transistor and the second set of data memory cells. The second set of data memory cells arranged between the first set of data memory cells and the second select transistor. The non-volatile memory device also comprises a control circuit configured to erase the first set of data memory cells while maintaining valid data in the second set of data memory cells when a trigger condition with respect to the erase of the first set of data memory cells is not met. The control circuit is configured to sense threshold voltages of the first select transistors in response to the trigger condition being met. The control circuit is configured to move valid data out of the second set of data memory cells to another location in response to a determination that more than an allowed number of the first select transistors have a threshold voltage outside of a target range. The control circuit is configured to adjust threshold voltages of the first select transistors after moving the valid data out of the second set of data memory cells to the other location such that no more than the allowed number of the first select transistors have a threshold voltage outside of the target range.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   a memory interface configured to be connected to non-volatile memory; and
   a processor circuit connected to the memory interface, the processor circuit configured to:
   test a threshold voltage criterion of non-data transistors associated with memory cells that reside in a stack in the non-volatile memory, the test in response to a trigger condition being met with respect to an erase of a first set of data memory cells that reside in a first tier of the stack, the memory cells including a second set of data memory cells that reside in a second tier of the stack;
   move valid data out of the second set of data memory cells to another location in the non-volatile memory in response to a determination that the threshold voltage criterion is not met; and
   adjust threshold voltages of the non-data transistors after moving the valid data out of the second set of data memory cells to the other location such that the threshold voltage criterion is met for the non-data transistors.

2. The apparatus of claim 1, wherein:
   the trigger condition is based on a count of a number of erases of the first set of data memory cells; and
   the processor circuit is further configured to erase the first set of data memory cells while maintaining valid data in the second set of data memory cells when the trigger condition is not met.

3. The apparatus of claim 2, wherein:
   the trigger condition is further based on whether the threshold voltage criterion of the non-data transistors has been tested in response to an erase of the second set of data memory cells.

4. The apparatus of claim 2, wherein the processor circuit is further configured to:
   store information that indicates that the threshold voltage criterion of the non-data transistors has been tested in response to the trigger condition being met with respect to the erase of the first set of data memory cells; and
   skip a test of the threshold voltage criterion of the non-data transistors when a count of a number of erases of the second set of data memory cells reaches a threshold that indicates the test should otherwise be performed if the stored information indicates that the threshold voltage criterion of the non-data transistors has been tested in response to the trigger condition being met with respect to the erase of the first set of data memory cells.

5. The apparatus of claim 1, wherein:
the memory cells are part of a group of NAND strings;
the apparatus further comprises a plurality of bit lines;
the non-data transistors comprise a select transistor on each NAND string connected to one of the bit lines, each select transistor having a control terminal;
the apparatus further comprises a select line connected to the control terminal of each select transistor; and
to test the threshold voltage criterion the processor circuit is further configured to determine whether more than an allowed number of the select transistors have a threshold voltage outside of a target range.

6. The apparatus of claim 1, wherein:
the memory cells are part of a group of NAND strings;
the apparatus further comprises a source line;
the non-data transistors comprise a select transistor on each NAND string connected to the source line, each select transistor having a control terminal;
the apparatus further comprises a select line connected to the control terminal of each select transistor; and
to test the threshold voltage criterion the processor circuit is further configured to determine whether more than an allowed number of the select transistors have a threshold voltage outside of a target range.

7. The apparatus of claim 1, wherein:
the memory cells are part of a group of NAND strings;
the non-data transistors comprise a dummy memory cell transistor on each NAND string; and
to test the threshold voltage criterion the processor circuit is further configured to determine whether more than an allowed number of the dummy memory cell transistors have a threshold voltage outside of a target range.

8. The apparatus of claim 1, wherein:
the memory cells are part of a group of NAND strings;
the non-data transistors comprise a first select transistor at a first end of each NAND string and a second select transistor at a second end of each NAND string, the first set of data memory cells is arranged between the first select transistor and the second set of data memory cells, the second set of data memory cells is arranged between the first set of data memory cells and the second select transistor.

9. The apparatus of claim 8, wherein:
the data transistors further comprise a third set of data memory cells arranged between the second set of data memory cells and the second select transistor; and
the processor circuit is further configured to move valid data out of the third set of data memory cells to another location in response to the determination that the threshold voltage criterion is not met and prior to adjusting the threshold voltages of the non-data transistors such that the threshold voltage criterion is met.

10. A method of operating non-volatile storage, the method comprising:
testing whether a threshold voltage distribution of a set of select transistors for groups of memory cells in a stack in a three-dimensional memory array is outside of a target range, each group of memory cells comprising a first set of data memory cells that reside in a first tier of the stack and a second set of data memory cells that reside in a second tier of the stack, the testing in response to a program/erase count of the first sets of data memory cells exceeding a threshold;
moving valid data out of the second sets of data memory cells to another location in response to a determination that the threshold voltage distribution is outside of the target range; and
adjusting threshold voltages of the set of select transistors after moving the valid data out of the second sets of data memory cells to the other location such that the threshold voltage distribution is within the target range.

11. The method of claim 10, further comprising:
erasing the first sets of data memory cells while maintaining valid data in the second sets of data memory cells when the program/erase count of the first sets of data memory cells does not exceed the threshold.

12. The method of claim 10, further comprising:
storing information that indicates that the threshold voltage distribution of the set of select transistors has been tested in response to the program/erase count of the first sets of data memory cells exceeding the threshold; and
skipping a test of the threshold voltage distribution of the set of select transistors when a program/erase count of the second sets of data memory cells reaches a threshold that indicates the test should otherwise be performed if the stored information indicates that the threshold voltage distribution of the set of select transistors has been tested in response to the program/erase count with respect to the erase of the first sets of data memory cells exceeding the threshold.

13. The method of claim 10, wherein testing the threshold voltage distribution of the set of select transistors comprises:
testing whether more than an allowed number of the set of select transistors have a threshold voltage outside of the target range for the threshold voltage distribution.

14. The method of claim 10, wherein testing the threshold voltage distribution of the set of select transistors comprises:
testing the threshold voltages of drain side select transistors on a group of NAND strings, each drain side select transistor connected to a different bit line, each drain side select transistor having a control terminal that is connected to the same select line.

15. The method of claim 10, wherein testing the threshold voltage distribution of the set of select transistors comprises:
testing the threshold voltages of source side select transistors on a group of NAND strings, each source side select transistor connected to a source line, each source side select transistor having a control terminal that is connected to the same select line.

16. A non-volatile memory device, comprising:
a three-dimensional memory array comprising groups memory cells, a first select transistor at a first end of each group, a second select transistor at a second end of each group, each group comprising a first set of data memory cells and a second set of data memory cells, the first set of data memory cells arranged between the first select transistor and the second set of data memory cells, the second set of data memory cells arranged between the first set of data memory cells and the second select transistor; and
a control circuit configured to:
erase the first set of data memory cells while maintaining valid data in the second set of data memory cells when a trigger condition with respect to the erase of the first set of data memory cells is not met;
sense threshold voltages of the first select transistors in response to the trigger condition being met;
move valid data out of the second set of data memory cells to another location in response to a determination that more than an allowed number of the first select transistors have a threshold voltage outside of a target range; and adjust threshold voltages of the first select transistors after moving the valid data out of the second set of data memory cells to the other location such that no more than the allowed number of the first select transistors have a threshold voltage outside of the target range.

17. The non-volatile memory device of claim 16, wherein:
the trigger condition is further based on whether the threshold voltages of the first select transistors have been sensed in response to an erase of the second set of data memory cells.

18. The non-volatile memory device of claim 16, wherein:
the non-volatile memory device further comprises a plurality of bit lines;
the first select transistor associated with a group is connected to a different one of the plurality of bit lines;
each of the first select transistors comprises a control gate; and
the non-volatile memory device further comprises a select line connected to the control gate of each of the first select transistors.

19. The non-volatile memory device of claim 16, wherein:
the non-volatile memory device further comprises a source line;
the first select transistor associated with a group comprises a control terminal connected to the source line; and
the non-volatile memory device further comprises a select line connected to the control terminal of each first select transistor.

20. The non-volatile memory device of claim 16, wherein:
each group further comprises a third set of data memory cells arranged between the second set of data memory cells and the second select transistor; and
the control circuit is further configured to move valid data out of the third set of data memory cells to another location in response to the determination that more than the allowed number of the first select transistors have a threshold voltage outside of the target range and prior to adjusting the threshold voltages of the first select transistors.

* * * * *